United States Patent
Ema

[11] Patent Number: 6,144,058
[45] Date of Patent: *Nov. 7, 2000

[54] LAYER STRUCTURE HAVING CONTACT HOLE, METHOD OF PRODUCING THE SAME, FIN-SHAPED CAPACITOR USING THE LAYER STRUCTURE, METHOD OF PRODUCING THE FIN-SHAPED CAPACITOR AND DYNAMIC RANDOM ACCESS MEMORY HAVING THE FIN-SHAPED CAPACITOR

[75] Inventor: Taiji Ema, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/453,509

[22] Filed: May 30, 1995

Related U.S. Application Data

[63] Continuation of application No. 08/190,573, Feb. 2, 1994, abandoned, which is a continuation of application No. 07/666,069, Mar. 7, 1991, abandoned.

[30] Foreign Application Priority Data

| Mar. 8, 1990 | [JP] | Japan | 2-54883 |
| Sep. 6, 1990 | [JP] | Japan | 2-234585 |
| Oct. 23, 1990 | [JP] | Japan | 2-283370 |
| Oct. 23, 1990 | [JP] | Japan | 2-283371 |

[51] Int. Cl.$^7$ ............. H01L 27/108; H01L 29/76; H01L 29/94; H01L 31/119
[52] U.S. Cl. ............. 257/308; 257/309
[58] Field of Search ............. 357/23.6; 257/296, 257/301, 303, 306, 307, 308, 309

[56] References Cited

U.S. PATENT DOCUMENTS

| 4,897,709 | 1/1990 | Yokoyama et al. . | |
| 4,957,874 | 9/1990 | Soejima | 437/31 |
| 4,970,564 | 11/1990 | Kimura et al. | 357/23.6 |
| 4,974,040 | 11/1990 | Taguchi et al. | 257/306 |
| 5,126,810 | 6/1992 | Gotou | 357/23.6 |
| 5,135,883 | 8/1992 | Bae et al. | 357/23.6 |

FOREIGN PATENT DOCUMENTS

| 0 010 596 | 11/1978 | European Pat. Off. . |
| 0295 709 A2 | 6/1988 | European Pat. Off. . |

(List continued on next page.)

OTHER PUBLICATIONS

European Search Report for European Patent Application No. 96 118 058.5 dated Nov. 3, 1999.
T. Ema et al., "3–Dimensional Stacked Capacitor Cell for 16M and 64M Drams", International Electron Devices Meetings, 592–IEDM 88, Dec. 11–14, 1988 (a copy thereof is attached hereto).

(List continued on next page.)

*Primary Examiner*—Ngân V. Ngô
*Attorney, Agent, or Firm*—Staas & Halsey LLP

[57] ABSTRACT

A dynamic random access memory (DRAM) device includes a stacked capacitor including a storage electrode, a dielectric film and a cell plate. In a preferred embodiment, the storage electrode contacts with a diffusion region of a substrate through a contact hole. The storage electrode has a first fin which has a first uniform portion with a width greater than the width of the contact hole, and a second uniform portion serving as a side wall, which is formed around an inner-wall of the first uniform portion defining the first opening, so that a second opening defined by the second uniform portion, has a width which is substantially identical to the width of the contact hole. The use of the second uniform portion to form the stacked capacitor allows for a reduction in the size of the contact hole relative to the conventional DRAM devices, and therefore allows for a reduction in the overall size of the DRAM device of the present invention, relative to conventional DRAM devices.

34 Claims, 38 Drawing Sheets

FOREIGN PATENT DOCUMENTS

| | | |
|---|---|---|
| 0 280 587 | 8/1988 | European Pat. Off. . |
| 295 709 | 12/1988 | European Pat. Off. . |
| 3916228 A1 | 5/1988 | Germany . |
| 3916228 | 11/1989 | Germany . |
| 006 628 A2 | 6/1981 | Japan . |
| 60-106163 | 6/1985 | Japan . |
| 60-224218 | 11/1985 | Japan . |
| 61-193477 | 8/1986 | Japan . |
| 63-116430 | 5/1988 | Japan . |
| 63-119239 | 5/1988 | Japan . |
| 63-253661 | 10/1988 | Japan . |
| 63-291437 | 11/1988 | Japan . |
| 1 022 057 | 1/1989 | Japan . |
| 1-137666 | 5/1989 | Japan . |
| 1-147857 | 6/1989 | Japan . |
| 1-154549 | 6/1989 | Japan . |
| 1 179 449 | 7/1989 | Japan . |
| 1/189949 | 7/1989 | Japan . |
| 1-241857 | 9/1989 | Japan . |
| 1 265 556 | 10/1989 | Japan . |
| 1-270343 | 10/1989 | Japan . |
| 90-15320 | 10/1990 | Rep. of Korea . |
| 2 219 690A | 12/1988 | United Kingdom . |

OTHER PUBLICATIONS

Journal of the Electrochemical Society, vol. 138, No. 2, Feb. 1991, Manchester, New Hampshire US, pp. 619–620; Shih Wei Sun; "A Polysilicon Hard–Mask/Spacer Process for Sub–0.5 Micron ULSI Contacts".

Japanese Journal Of Applied Physics, 21st Conference On Solid State Devices & Materials, Extended Abstracts, Aug. 28, 1989, Tokyo Japan, pp. 141–144; S. Inoue et al.: "A New Stacked Capacitor Cell With Thin Box Structured Storage Node".

Korean Search Report dated Dec. 20, 1994 in corresponding Korean application.

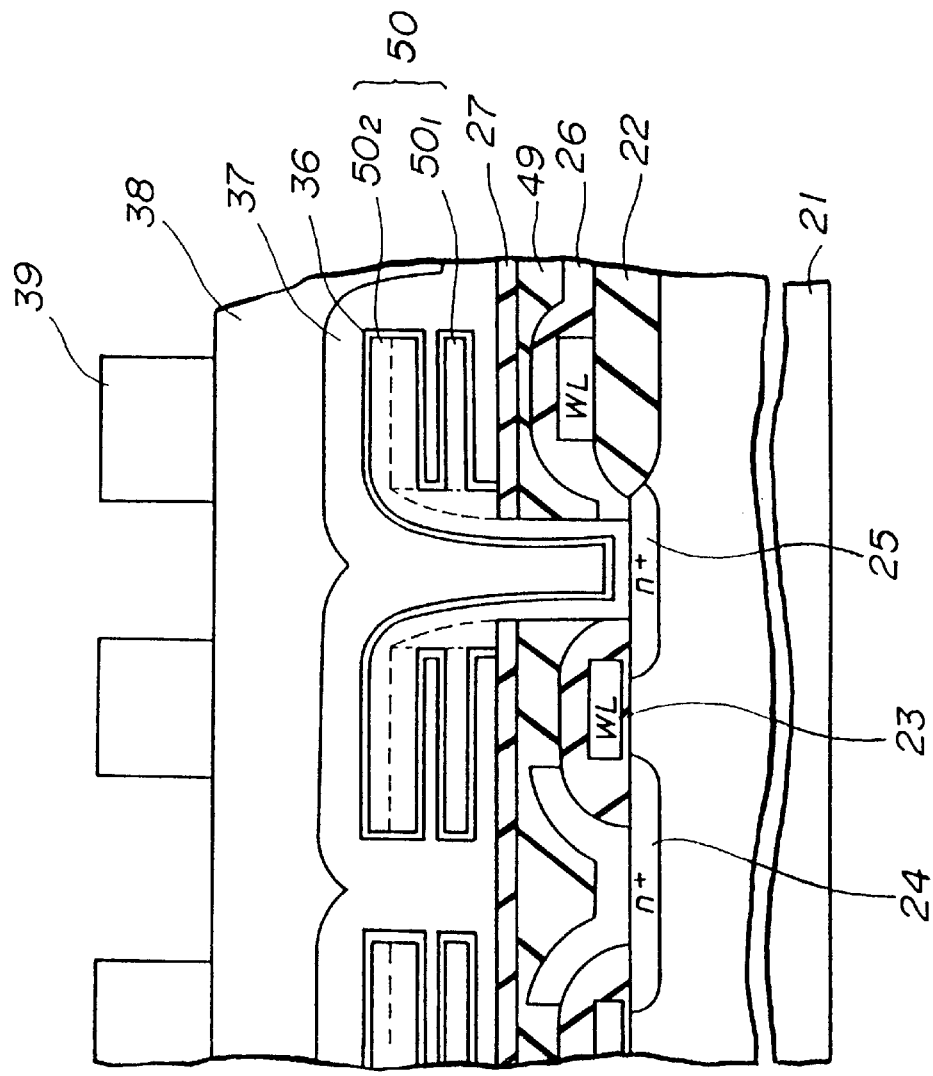

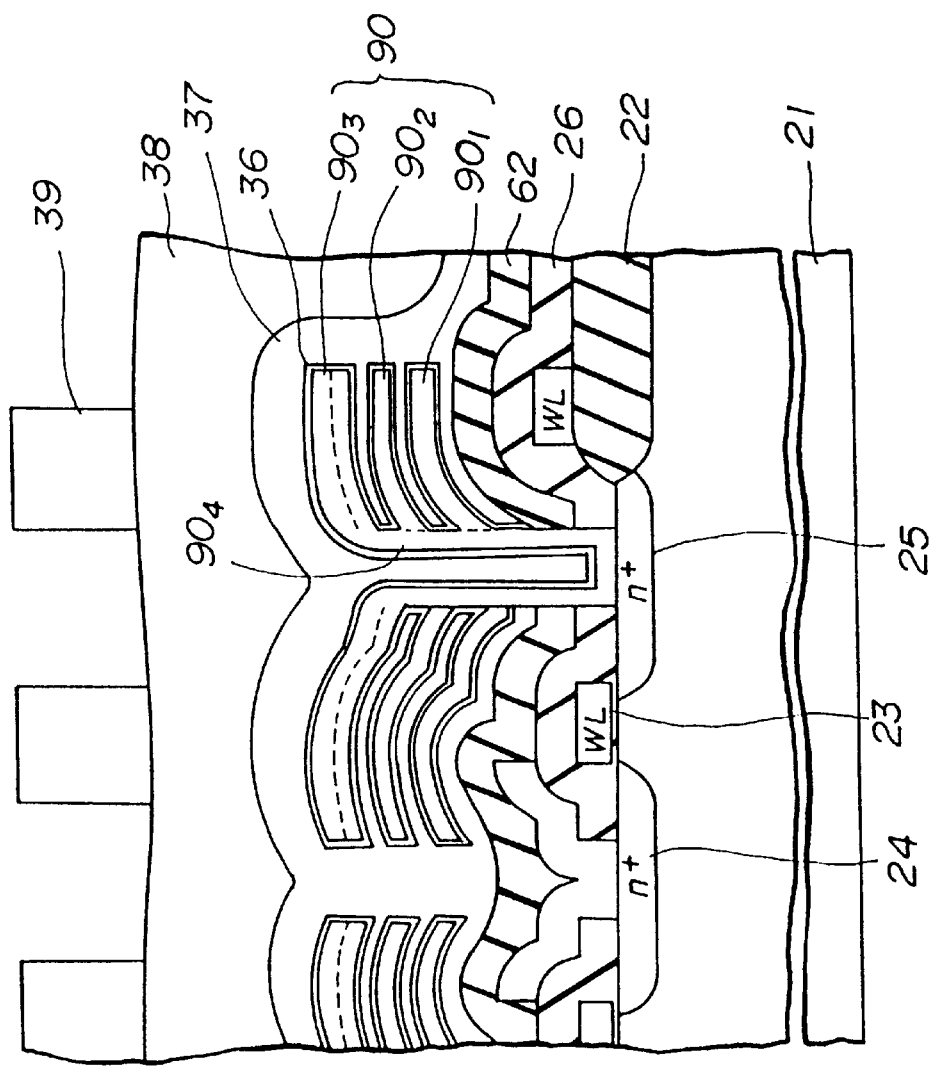

LAYER STRUCTURE HAVING CONTACT HOLE, METHOD OF PRODUCING THE SAME, FIN-SHAPED CAPACITOR USING THE LAYER STRUCTURE, METHOD OF PRODUCING THE FIN-SHAPED CAPACITOR AND DYNAMIC RANDOM ACCESS MEMORY HAVING THE FIN-SHAPED CAPACITOR

This application is a continuation of application Ser. No. 08/190,573, filed Feb. 2, 1994, now abandoned, which is a continuation of application Ser. No. 07/666,069, filed Mar. 7, 1991, now abandoned.

BACKGROUND OF THE INVENTION

The present invention generally relates to a layer structure having a contact hole suitable for dynamic random access memories having fine contact holes, and a method of producing such a layer structure. More particularly, the present invention is concerned with a fin-shaped capacitor having such a layer structure, and a method of forming such a fin-shaped capacitor. Furthermore, the present invention is concerned with a dynamic random access memory having such a fin-shaped capacitor.

Recently, there has been considerable activity as regards the development of 64Mbit dynamic random access memories (DRAM). There are known DRAMs having three-dimensional stacked capacitor cells capable of providing a storage capacity equal to or higher than 64Mbits (see Japanese Laid-Open Patent Application Nos. 1-137666, 1-147857 and 1-154549, U.S. Pat. No. 4,974,040 and T. Ema et al., "3-DIMENSIONAL STACKED CAPACITOR CELL FOR 16M AND 64M DRAMS", International Electron Devices Meetings, 592-IEDM 88, Dec. 11–14, 1988). In order to increase the integration density, it is necessary to reduce the two-dimensional size of each memory cell without reducing the capacitance of each stacked capacitor.

In order to fabricate 64Mbit DRAMs, a feature scale approximately equal to 0.3 [$\mu$m] is required. However, the conventional photolithography technique can realize a feature scale approximately equal to a maximum of 0.5 [$\mu$m]. 64Mbit DRAMs can be realized by reducing the size of each storage (stacked) capacitor. For this purpose, it is necessary to reduce the size of a contact window (opening) for a storage electrode which is a part of the stacked capacitor. As described above, since the feature scale realized by the conventional photolithography technique is approximately 0.5 [$\mu$m], it is impossible to form the contact window having a size approximately equal to 0.3 [$\mu$m]. It is also necessary to reduce the size of a window (contact hole) provided for connecting a word line formed of, for example, polysilicon, and a low-resistance wiring line (word-line shunt layer) formed of Al or Al alloy, directed to preventing the occurrence of a delay in signal transmission in the word line.

Japanese Laid-Open Patent Application No. 63-119239 discloses a method for forming a fine pattern narrower than a feature scale limit of the conventional photolithography technique. The application teaches a process in which polysilicon, PSG or $SiO_2$ is grown on an $SiO_2$ mask having a window through which a substrate is partially exposed, and a grown film on the mask and the exposed substrate surface is anisotropically etched, so that a sidewall is formed on the substrate so that it is formed around the entire inner wall of the window in the mask. The distance between opposite surfaces of the sidewall in the window is less than the feature scale limit. Thus, a surface area of the substrate less than the feature scale limit is exposed through the sidewall in the window. Then, the substrate is etched in such a way that the combination of the sidewall and the mask function as an etching mask, so that a hole is formed in the substrate.

The above-mentioned Patent Application discloses an arrangement in which the mask is formed of $SiO_2$ and a member to be processed is formed of Si. Thus, the removal of the mask material can be easily made. However, when a multilayer structure, such as DRAMS, is produced, it is necessary to consider three layers of a mask material, a material to be processed and a underlying material which is located under the processed material and which is exposed through a hole formed in the processed material. In this case, it is necessary to prevent the exposed portion of the underlaying material from be damaged during a process in which the mask material is removed. Further, if the mask material is left in the finalized products, it is necessary to have no problem arising from the existence of the left mask material. The above-mentioned Japanese Application does not suggest the above matters.

Japanese Laid-Open Patent Application No. 60-224218 discloses the use of a sidewall directed to providing a window (contact hole) smaller than the feature scale limit of the conventional photolithography technique. The sidewall is formed of Al and formed on an $SiO_2$ layer and around an inner wall of a window formed in a silicon nitride ($Si_3N_4$) layer also formed on the $SiO_2$ layer. The $SiO_2$ layer is selectively etched in such a way that the Al sidewall and the $Si_3N_4$ layer function as mask layers. However, it is very difficult to form the Al sidewall in contact with the inner wall of the window in the $Si_3N_4$ layer, since Al has a poor coverage characteristic. Further, it is necessary to form the $Si_3N_4$ layer which is sufficiently thick, because the selective etching ratio of $Si_3N_4$ to $SiO_2$ is small.

Japanese Laid-Open Patent Application No. 63-116430 (which corresponds to U.S. patent application Ser. No. 924,223 filed on Oct. 28, 1986) teaches the use of a sidewall for forming a hole smaller than the scale limit of the conventional photolithgraphy technique. The just above application shows a lift-off process for removing the mask material. However, the lift-off process has a problem in that some of the mask material separated from the substrate is re-adhered hereto. This frequently causes a pattern fault in a subsequent process. The Japanese application of concern does not disclose an effective step to process the mask material. Further, the Japanese application shows a sidewall formed on the side surface of a photosensitive material. It is necessary to form the sidewall at a low temperature due to the thermal stability of the photosensitive material. Thus, there is a great limitation regarding the selection of mask materials. In addition, the structure shown in the Japanese application of concern is limited to a special application.

SUMMARY OF THE INVENTION

It is a general object of the present invention to provide an improved layer structure having a contact hole, in which the above-mentioned disadvantages are eliminated.

A more specific object of the present invention is to provide a layer structure having a contact hole suitable for DRAMs.

The above-mentioned objects of the present invention are achieved by a method of forming a structure having a contact hole comprising the steps of:

(a) forming an insulating layer on a first conductive layer;
(b) forming a second conductive layer on the insulating layer;

(c) forming an opening in the second conductive layer;

(d) forming a conductive sidewall around an inner wall of the first conductive layer defining the opening;

(e) selectively etching the insulating layer in a state where the second conductive layer and the conductive sidewall function as etching masks, so that the contact hole having a width smaller than that of the opening and defined by the conductive sidewall is formed, and the first conductive layer is exposed through the contact hole; and (f) removing the second conductive layer and the conductive sidewall.

The above-mentioned objects of the present invention are also achieved by a method of forming a structure having a contact hole comprising the steps of:

(a) forming an insulating layer on a first conductive layer;

(b) forming a second conductive layer on the insulating layer;

(c) forming an opening in the second conductive layer;

(d) forming a conductive sidewall around an inner wall of the first conductive layer defining the opening;

(e) selectively etching the insulating layer in a state where the second conductive layer and the conductive sidewall function as etching masks, so that the contact hole having a width smaller than that of the opening and defined by the conductive sidewall is formed on the insulating layer and the first conductive layer is exposed through the contact hole;

(f) forming a barrier layer on the second conductive layer, the conductive sidewall and the first conductive layer exposed through the contact hole; and (g) forming a third conductive layer on the barrier layer, the barrier layer preventing the third conductive layer from reacting with the second conductive layer and the conductive sidewall.

The above-mentioned objects of the present invention are also achieved by a method of forming a structure having a contact hole comprising the steps of:

(a) forming an insulating layer on a first conductive layer;

(b) forming a second conductive layer on the insulating layer;

(c) forming an opening in the second conductive layer;

(d) forming a conductive sidewall around an inner wall of the first conductive layer defining the opening;

(e) selectively etching the insulating layer in a state where the second conductive layer and the conductive sidewall function as etching masks, so that the contact hole having a width smaller than that of the opening and defined by the conductive sidewall is formed, and the first conductive layer is exposed through the contact hole; and (f) forming a third conductive layer on the second conductive layer, the conductive sidewall and the member exposed through the contact hole, wherein:
the second conductive layer comprises polysilicon;
the conductive sidewall comprises polysilicon; and
the third conductive layer comprises tungsten.

The aforementioned objects of the present invention are achieved by a method of forming a structure having a contact hole comprising the steps of:

(a) forming an insulating layer on a first conductive layer;

(b) forming a second conductive layer on the insulating layer;

(c) forming a first opening in the second conductive layer;

(d) selectively growing a third conductive layer on the second conductive layer and an inner wall of the second conductive layer defining the first opening, so that a second opening defined by the third conductive layer and having a width smaller than that of the first opening is formed; and (e) selectively etching the insulating layer in a state where the third conductive layer functions as an etching mask, so that the contact hole having a width substantially identical to the second opening defined by the third conductive layer is formed, and the first conductive layer is exposed through the contact hole.

Another object of the present invention is to provide a layer structure having a contact hole as formed by the above-mentioned methods.

This object of the present invention is achieved by a layer structure comprising:

a first conductive layer;

an insulating layer formed on the first conductive layer and having a contact hole, the first conductive layer being exposed through the contact hole;

a second conductive layer formed on the insulating layer and having an opening having a width larger than that of the contact hole;

a conductive sidewall formed on the insulating layer exposed through the opening and formed around an inner wall of the second conductive layer defining the opening, the conductive sidewall having a width substantially equal to that of the contact hole;

a barrier layer formed on the second conductive layer, the conductive sidewall and the first conductive layer exposed through the contact hole; and a third conductive layer formed on the barrier layer, the barrier layer preventing the third conductive layer from reacting with the second conductive layer and the conductive sidewall.

The above-mentioned object of the present invention is achieved by a layer structure comprising:

a first conductive layer;

an insulating layer formed on the first conductive layer and having a contact hole, the first conductive layer being exposed through the contact hole;

a second conductive layer formed on the insulating layer and having a first opening having a width larger than that of the contact hole;

a third conductive layer formed on the insulating layer exposed through the first opening and the second conductive layer and formed around an inner wall of the second conductive layer defining the first opening, the third conductive layer defining a second opening having a width substantially equal to that of the contact hole, the second opening being continuously connected to the contact hole;

a barrier layer formed on the third conductive layer and the first conductive layer exposed through the contact hole; and a fourth conductive layer formed on the barrier layer, the barrier layer preventing the fourth conductive layer from reacting with the third conductive layer and the conductive sidewall.

The above-mentioned object of the present invention is also achieved by a layer structure comprising:

a first conductive layer;

an insulating layer formed on the first conductive layer and having a contact hole, the first conductive layer being exposed through the contact hole;

a second conductive layer formed on the insulating layer and having an opening having a width larger than that of the contact hole;

a conductive sidewall formed on the insulating layer exposed through the opening and formed around an inner wall of the second conductive layer defining the opening, the conductive sidewall having a width substantially equal to that of the contact hole; and a third conductive layer formed on the second conductive layer, the conductive sidewall and the first conductive layer exposed through the contact hole, wherein the third conductive layer comprises a material which causes no reaction with the second conductive layer and the conductive sidewall.

According to the present invention, there is also provided a dynamic random access memory having any of the above-mentioned structures.

According to the present invention, there is also provided a fin-shaped capacitor and a method for producing such a fin-shaped capacitor.

BRIEF DESCRIPTION OF THE DRAWINGS

Other objects, features and advantages of the present invention will become more apparent from the following detailed description when read in conjunction with the accompanying drawings, in which:

FIGS. 14A through 14G are cross-sectional views showing a modification of the variation shown in FIGS. 13A through 13F; and FIG. 15A through 15J are cross-sectional views showing a tenth preferred embodiment of the present invention.

DESCRIPTION OF THE PREFERRED EMBODIMENTS

A description will now be given of a first preferred embodiment of the present invention with reference to FIG. 1A through FIG. 1H.

Figure 1A:
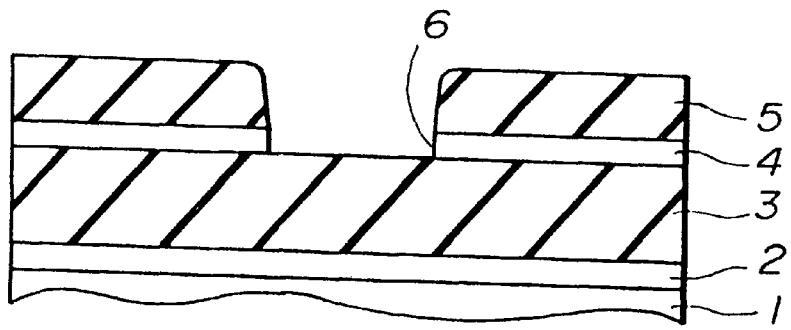
FIG. 1A through FIG. 1H are cross-sectional views showing steps of an improved method for producing a layer structure having a contact hole according to a first preferred embodiment of the present invention.

Referring to FIG. 1A, a conductive layer 2 formed of, for example, polysilicon, is formed on a base 1 formed of an insulator, such as $SiO_2$. The polysilicon layer 2 is a word line of a DRAM, for example. An insulating layer 3 formed of, for example, BPSG (boron-phosphosilicate glass), is grown to, for example, 0.5 μm on the entire surface by a CVD process. The BPSG layer 3 is heated in a wet atmosphere at 850° C. for 10 minutes, and reflown, so that a substantially flat surface of the BPSG layer 3 can be formed. Then, a polysilicon layer 4 is grown to, for example, 1000 angstrom by the CVD process. After that, a photoresist film 5 is coated, and etched by the conventional photolithography technique, so that the photoresist film 5 functions as an etching resist having a hole pattern can be formed. Subsequently, the polysilicon layer 4 is selectively etched by an RIE (reactive ion etching) process in which a $CCl_4/O_2$ gas is used and the photoresist film 5 functions as an etching mask. Thereby, a first opening 6 having a width (diameter) approximately equal to 0.5 μm is formed in the polysilicon layer 4.

Figure 1B:
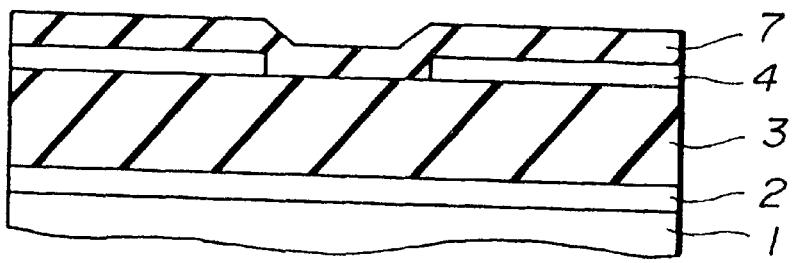
Figure 1C:
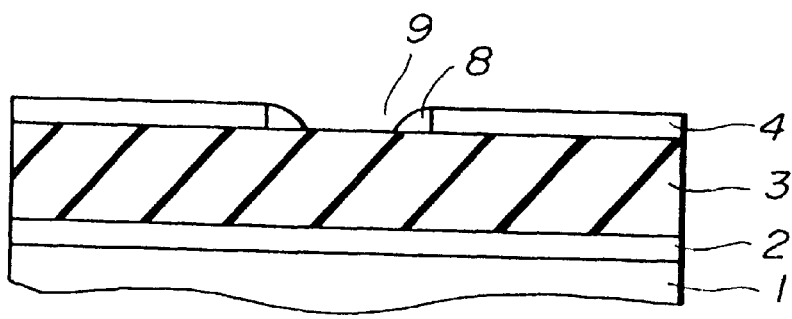

As shown in FIG. 1B, a polysilicon layer 7 is grown to, for example, 1500 angstroms on the entire surface including the first opening 6 by CVD. Then, as shown in FIG. 1C, the polysilicon layer 7 is selectively etched by the RIE process using a $CCl_4/O_2$ gas, so that a sidewall 8 is formed on an inner wall (sidewall) of the first opening 6 formed in the polysilicon layer 4. The sidewall 8 defines a second opening 9 having a width approximately equal to 0.2 μm.

Figure 1D:
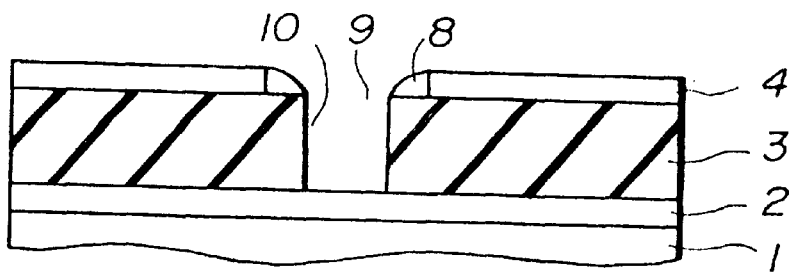

As shown in FIG. 1D, the BPSG layer 3 is selectively etched in an RIE process using a $CHF_3/He$ gas in which the polysilicon layer 4 and the sidewall 8 function as masks. Thereby, a contact hole 10 through which the polysilicon layer 2 is partially exposed is formed in the BPSG layer 3.

Figure 1E:
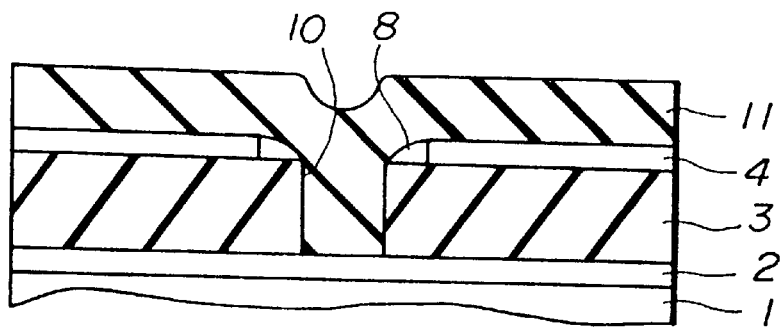
Figure 1F:
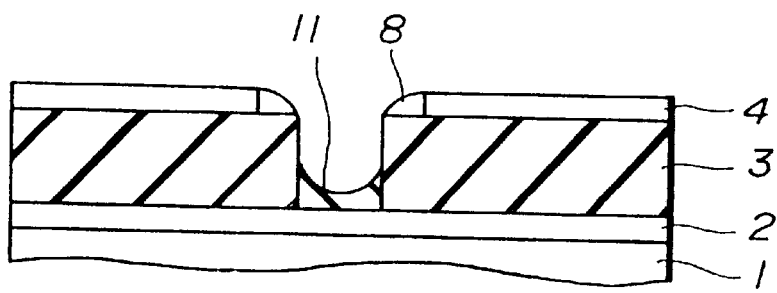
Figure 1G:
Figure 1H:
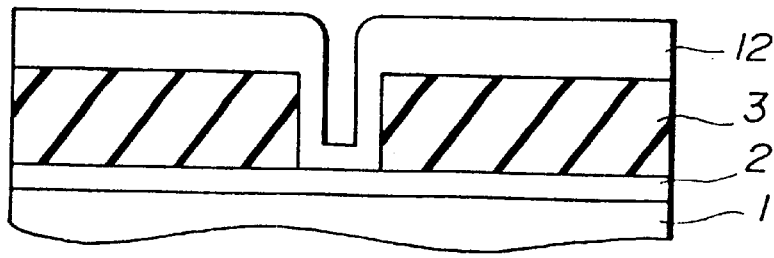

As shown in FIG. 1E, a photoresist film 11 is formed on the entire surface including the contact hole 10. Then, as shown in FIG. 1F, the entire surface of the photoresist film 11 is exposed and developed. During this process, a small amount of light enters a bottom portion of the contact hole 10. Thus, a part of the photoresist film 11 is left in the contact hole 10. The polysilicon layer 4 and the sidewall 18 are dry-etched in a $CF_4/O_2$ plasma atmosphere in a state where the polysilicon layer 2 is protected against dry etching due to the existence of the photoresist film 11 in the contact hole 10. During the dry etching process, the polysilicon layer 4 and the sidewall 8 are isotropically etched. After that, the photoresist film 11 is removed in an $O_2$ plasma.

After that, an Al alloy (or Al) 12 is deposited on the upper surface including the contact hole 10 by a sputtering process. Then, the Al alloy layer 12 is etched, so that a desired Al (or Al alloy) pattern is formed. Thereby, the polysilicon word line 2 is connected to the Al alloy layer 12 via the contact hole 10. It will be noted that the contact hole 10 has a width smaller than the feature scale limit of the conventional photolithographic technique. It will also be noted that the above-mentioned production method is suitable for forming a contact hole for connecting the word line and the word-line shunt layer which is provided for preventing the occurrence of a delay in transmitting a signal via the word line.

The BPSG layer 3 can be substituted for a stacked member in which a PSG layer and an $SiO_2$ layer are alternately stacked. It is also possible to employ an alternative step instead of the step shown in FIG. 1H. In the alternative step, after the polysilicon layer 4 and the sidewall 8 are removed, the BPSG layer 3 is reflowed by heating the device in an N₂ atmosphere at 850° C. for 20 minutes, so that an upper edge of the contact hole 10 is smoothly curved. The existence of such a smoothly curved upper edge of the contact hole 10 improves the coverage of the Al alloy layer 12.

Figure 2:
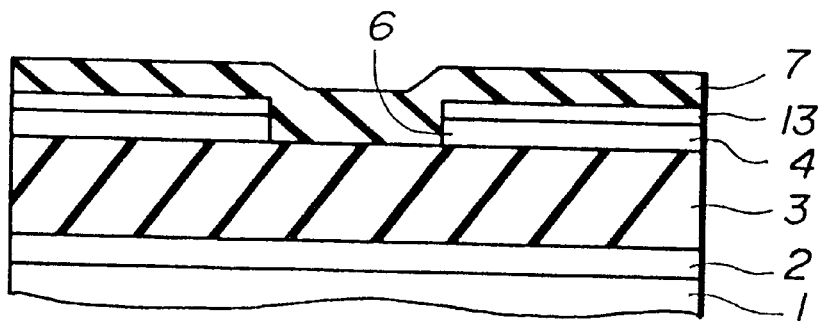
FIG. 2 is a cross-sectional view showing a second preferred embodiment of the present invention.

A description will now be given of a second preferred embodiment of the present invention with reference to FIG. 2. A layer structure shown in FIG. 2 is the same as that shown in FIG. 1B except that an $SiO_2$ layer 13 is formed on the polysilicon layer 4. More specifically, the $SiO_2$ film 13 is grown to, for example, about 200 angstroms on the polysilicon layer 4 by CVD. Then, the photoresist film 5 shown in FIG. 1A is formed on the entire surface. After that, the first opening 6 is formed in the $SiO_2$ layer 13 and the polysilicon layer 4. Then, the polysilicon layer 7 is formed on the photoresist film 5 and in the first opening 6 in the same way as shown in FIG. 1B. Then, the polysilicon layer 7 is anisotropically etched in the vertical direction. The $SiO_2$ layer 13 functions as an etching stopper during the step shown in FIG. 1C, so that it is possible to prevent a decrease in the thickness of the polysilicon layer 4. Further, it becomes easy to detect the end of etching since the $SiO_2$ layer 13 is exposed. It will be noted that the $SiO_2$ layer 13 is removed together with the BPSG layer 3 during the step shown in FIG. 1E. Thus, it is not necessary to provide a special step to remove the $SiO_2$ layer 13.

A description will now be given of a third preferred embodiment of the present invention with reference to FIGS. 3A through 3C, in which those parts which are the same as those shown in the previous figures are given the same reference numerals.

Figure 3A:
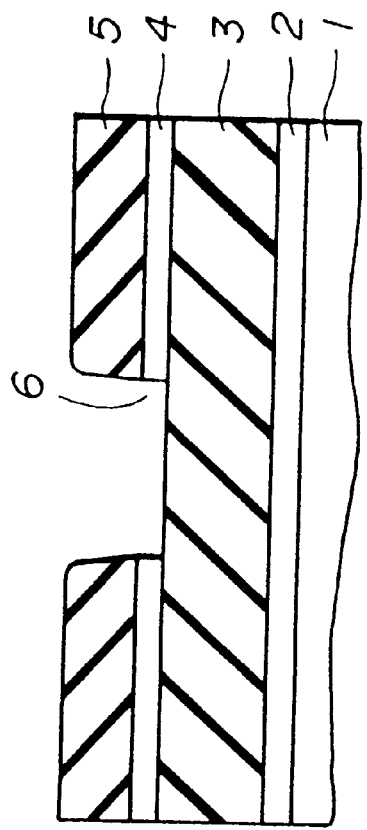
FIGS. 3A through 3D are cross-sectional views showing a third preferred embodiment of the present invention.

Referring to FIG. 3A, the BPSG layer 3 is grown to, for example, 0.5 μm on the entire surface including the polysilicon layer (word line) 2 by CVD. Next, the polysilicon layer 4 is grown to, for example, 1000 angstroms by CVD. Then, the photoresist film 5 is coated, and patterned by the conventional photolithography technique, so that a hole pattern having a width approximately equal to 0.5 μm is formed in the photoresist film 5. After that, the polysilicon layer 4 is selectively removed by an RIE process using a $CCl_4/O_2$ gas in which the photoresist film 5 serves as a mask, so that the first opening 6 is formed in the polysilicon layer 4.

Figure 3B:
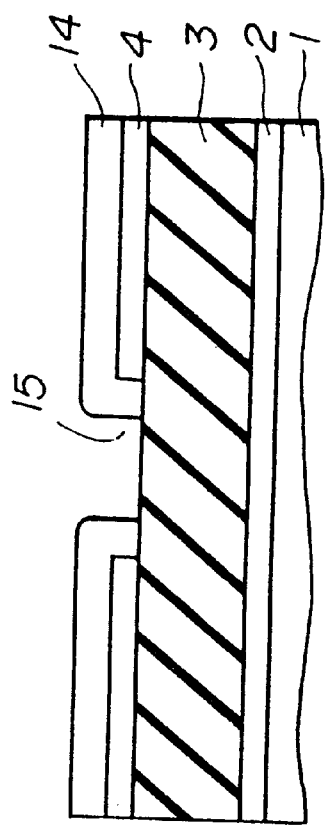

As shown in FIG. 3B, a polysilicon layer 14 is selectively grown on the upper surface of the polysilicon layer 4 and a side surface thereof by a CVD process in which the device is maintained at 650° C. and an $SiH_4+HCl+H_2$ gas is used. The polysilicon layer 14 defines a second opening 15 having a width smaller than that of the first opening 6. It is easy to control the thickness of the polysilicon layer 14, that is, easy to control the width of the second opening 15.

Figure 3C:
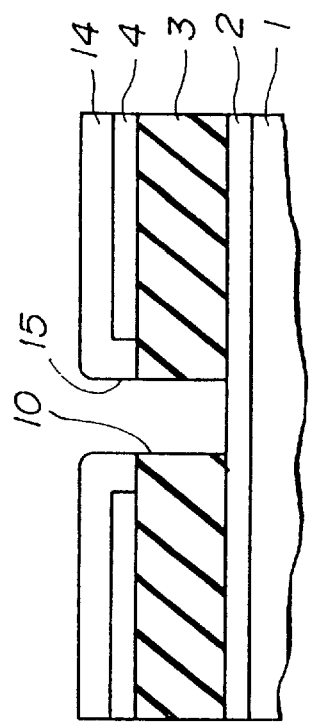
Figure 3D:
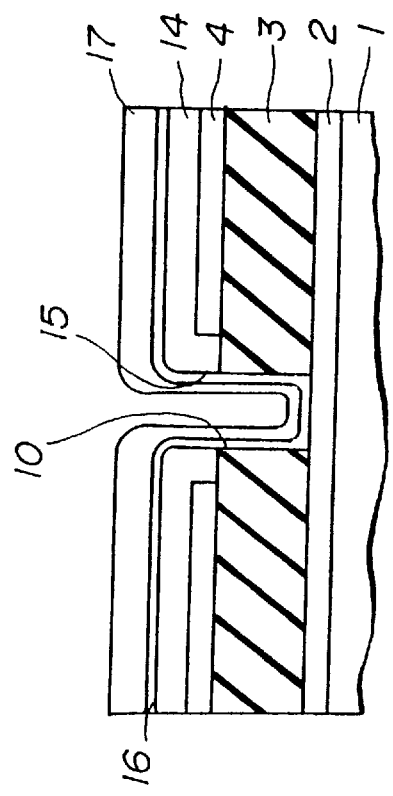

Then, as shown in FIG. 3C, the BPSG layer 3 is removed via the second opening 15 by an RIE process using a $CHF_3$/He gas, so that the contact hole 10 is formed and the polysilicon layer 2 is partially exposed through the contact hole 10. Finally, a stacked layer 16 fomed of a Ti/TiN layer 16 is formed on the polysilicon layer 14, and an Al alloy (or Al) layer 17 is formed on the stacked layer 16, as shown in FIG. 3D. The stacked layer 16 will be described in detail later.

Figure 4:
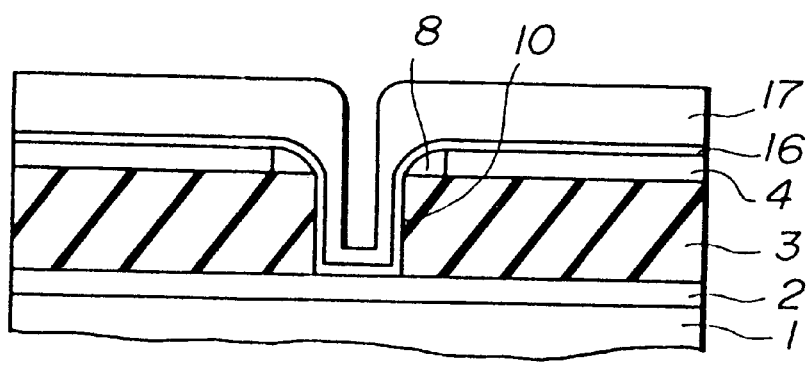
FIG. 4 is a cross-sectional view showing a fourth preferred embodiment of the present invention.

A description will now be given of a fourth preferred embodiment of the present invention with reference to FIG. 4, in which those parts which are the same as those shown in the previous figures are given the same reference numerals. In the step shown in FIG. 1G, the polysilicon layer 4 and the sidewall 8 are removed. On the other hand, according to the fourth embodiment of the present invention, as shown in FIG. 4, the polysilicon layer 4 and the sidewall 8 are not removed, but left on the BPSG layer 3. After the layer structure shown in FIG. 1D is obtained, the stacked layer 16 is formed on the entire surface including the polysilicon layer 4, the sidewall 8 and the exposed surface of the polysilicon layer 2 by CVD, for example. The stacked layer 16 consists of a Ti layer having a thickness of 200 angstroms and a TiN layer having a thickness of 1000 angstroms. Hereafter, the stacked layer 16 is referred to as a Ti/TiN layer 16. After the Ti/TiN layer 16 is formed, the Al alloy (or pure Al) 17 is deposited on the Ti/TiN layer 16 by sputtering. After that, the polysilicon layer 4, the Ti/TiN layer 16 and the Al alloy layer 17 are patterned by etching.

It will be noted that if the Al alloy layer (or pure Al layer) 17 is deposited directly on the polysilicon layer 4 and the polysilicon sidewall 8, it will easily react to silicon in the layer 4 and the sidewall 8 during a subsequent annealing process in which a protection cover is formed, for example. The above reaction increases the resistance of the Al alloy layer 17. The Ti/TiN layer 16 functions as a barrier layer which prevents the above-mentioned reaction. The barrier layer 16 is not limited to the Ti/TiN layer.

Figure 5:
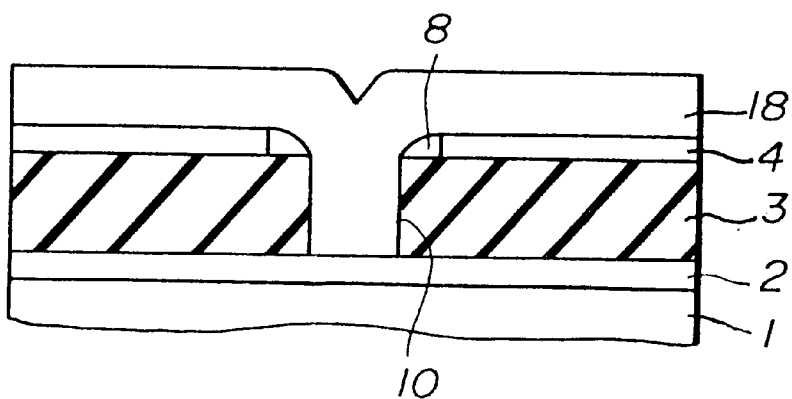
FIG. 5 is a cross-sectional view showing a fifth preferred embodiment of the present invention.

A description will now be given of a fifth preferred embodiment of the present invention with reference to FIG. 5, in which those parts which are the same as those shown in the previous figures are given the same reference numerals. The fifth embodiment shown in FIG. 5 has the left polysilicon layer 4 and the polysilicon sidewall 8, and uses a W (tungsten) layer functioning as a wiring line instead of the Al alloy (or pure Al) layer 17 shown in FIG. 4. The use of the W layer 18 does not need the deposition of the Ti/TiN layer 16.

After the layer structure shown in FIG. 1D is obtained, the W layer 18 is grown to, for example, 5000 angstroms on the entire surface including the polysilicon layer 4, the polysilicon sidewall 8 and the exposed surface of the polysilicon layer 2 by CVD. The contact hole 10 is filled with tungsten, so that the coverage of the W layer 18 can be improved. It will be noted that it is easy to fill the contact hole 10 with tungsten by CVD. It will be noted that tungsten has a poor adhesion to BPSG or $SiO_2$. On the other hand, as shown in FIG. 5, the W layer 18 is formed on the polysilicon layer 4 and the polysilicon sidewall 18. Thus, the adhession problem can be solved.

A description will now be given of a sixth preferred embodiment of the present invention with reference to FIG. 6A through FIG. 6N. The sixth preferred embodiment of the present invention provides a DRAM having a contact hole defined by a sidewall.

Figure 6A:
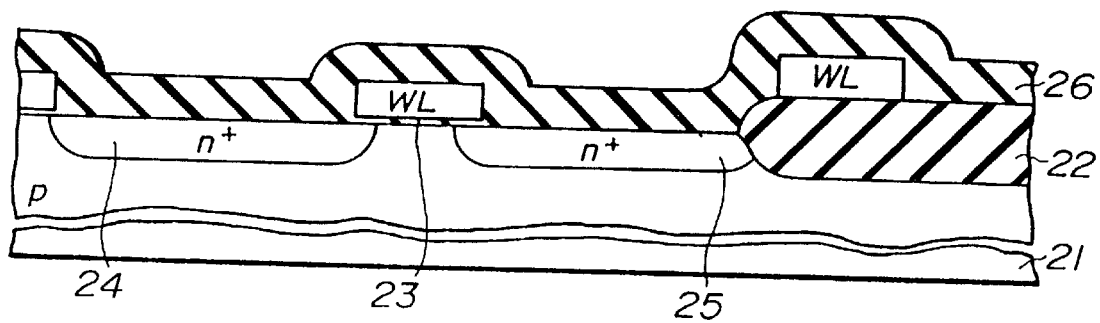
FIG. 6A through 6N are cross-sectional views showing steps of a DRAM production method according to a sixth preferred embodiment of the present invention.

Referring to FIG. 6A, an interlayer isolation insulating layer 22 is grown to, for example, 4000 angstroms on a p-type silicon substrate 21 by a selective thermal oxidation process (a local-oxidation-of-silicon process: LOCOS), in which a silicon nitride layer is used as an oxidation-resistant mask. Next, the silicon nitride layer serving as the oxidation-resistant mask is removed, so that active areas in the p-type silicon substrate 21 are exposed. Then, a gate insulating layer 23 having a thickness equal to, for example, 100 angstroms is formed on the exposed surfaces of the p-type silicon substrate 21 by a thermal oxidation process. After that, a polysilicon layer is grown to, for example, 1000 angstroms by CVD. Then, the polysilicon layer is patterned by a resist process and RIE process in the photolithography technique in which a $CCl_4/O_2$ gas is used. Thereby, word lines WL are formed. After that, As ions are introduced into the p-type silicon substrate 21 by an ion implantation process in which the word lines WL and the interlayer isolation insulating layer 2 function as masks. Thereby, an $n^+$-type source region 24 and an $N_+$-type drain region 25 of a transfer transistor of a memory cell are formed in the p-type silicon substrate 21. The dose of As ions is equal to, for example, $1×10^{15}$ atoms/cm$^2$. During a subsequent thermal process, the source and drain regions 24 and 25 are heated. After that, an insulating layer 26 formed of $SiO_2$ is grown to, for example, 1000 angstroms by CVD.

Figure 6B:
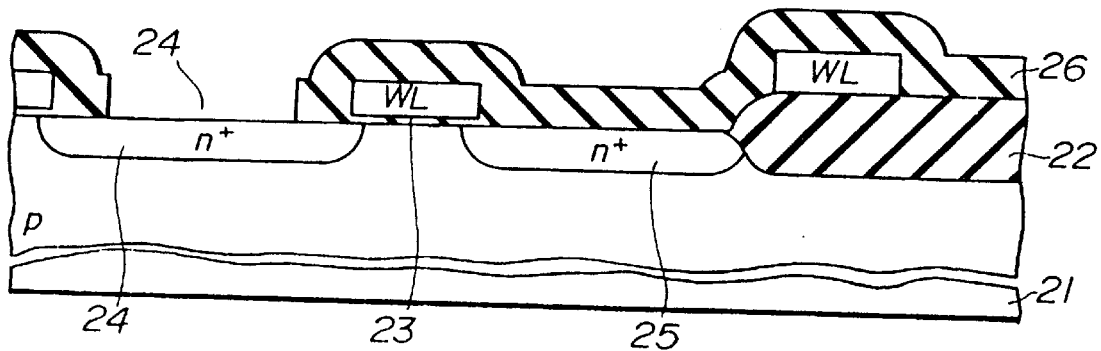

As shown in FIG. 6B, the $SiO_2$ insulating film 26 is selectively etched in an RIE process in which a $CHF_3/H_2$ gas is used, so that a bit line contact hole 24A is formed in the $SiO_2$ insulating film 26. It will be noted that if a positional error occurs in the bit line contact window 24A and thus the word line WL is partially exposed, an exposed portion of the word line WL can be compensated for, as will be described later. Thus, it is sufficient to provide an alignment margin approximately equal to 0.1 $\mu$m when the bit line contact window 24A is approximately 0.5 $\mu$m in diameter. As will be indicated later, it is preferable to remove a portion of the $SiO_2$ insulating layer 26 in a scribe area defined in a peripheral portion of a chip at the same time as then the bit line contact hole 24A is formed.

Figure 6C:
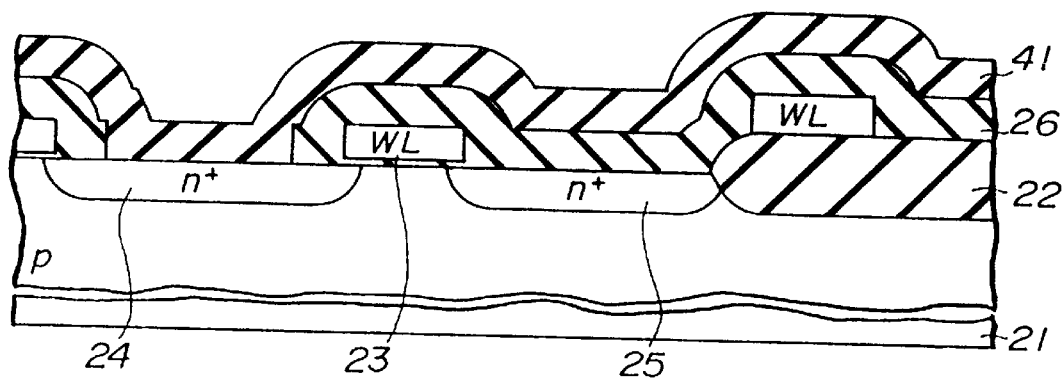

As shown in FIG. 6C, an $SiO_2$ insulating layer 41 is grown to, for example, 1000 angstroms on the entire surface by CVD.

Figure 6D:
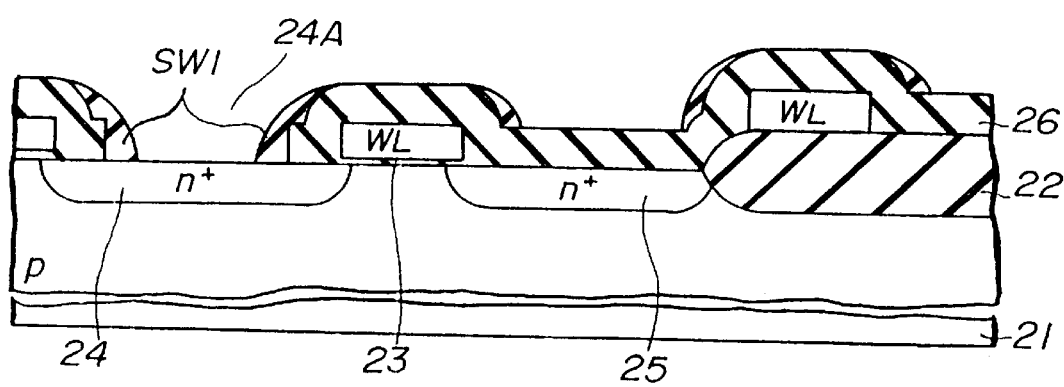

After that, as shown in FIG. 6D, the $SiO_2$ insulating layer 41 is selectively etched by an anisotropic etching process, such as, an RIE process using a $CHF_3/H_2$ gas. By this RIE process, a sidewall SW1 having an about 0.1 $\mu$m thickness is formed so that it surrounds a vertical inner wall of the bit line contact window 24A and a curved part of the $SiO_2$ insulating layer 26. The sidewall SW1 defines the width of the bit line contact hole 24A, which is approximately equal to 0.3 $\mu$m. It will be noted that this dimension, 0.3 $\mu$m, is considerably smaller than the scale limit by the conventional photolithography technique (approximately 0.5 $\mu$m). The formation of the sidewall SW1 contributes to reducing the alignment margin. Even if the word line WL is partially exposed due to the positional error of the bit line contact window 24A, the sidewall 24 will completely cover the exposed surface of the word line WL.

The above-mentioned contact hole forming process is distinguished from a known self-alignment contact formation method. In the self-alignment contact formation method, an insulating layer corresponding to the $SiO_2$ insulating layer 26 and a polysilicon layer provided for the word lines WL are patterned into an identical shape. Then, sidewalls are formed around windows. Thus, the windows are automatically defined by the sidewalls, so that there is no need for any alignment margin. Normally, the insulating film corresponding to the $SiO_2$ insulating layer 26 is 2000 angstroms thick, and the underlying polysilicon layer provided for forming the word lines WL is 1000 angstroms thick. Thus, the sidewall is about 3000 angstrom high, and is a large step portion formed on the surface of the substrate. On the other hand, the process which has been described with reference to FIG. 6D does not form such a great step surface portion. It should be noted that the sidewall SW1 is also formed on a step portion on the surface of the $SiO_2$ insulating film, so that the slope of the curved surface portion of the $SiO_2$ insulating layer 26 can be reduced.

It is necessary to etch only the $SiO_2$ insulating layer 41. As has been described previously, the scribe area on the peripheral portion of the chip is exposed during the process shown in FIG. 6B. Since the $SiO_2$ layer 41 is formed on the scribe area, etching is stopped when the scribe area which is a part of the p-type silicon substrate 21 appears. This judgment of whether or not the scribe area has appeared can be carried out by detecting a change of a plasma emitting state during the RIE process, or by detecting the film thickness of the scribe area by means of a laser interference instrument.

Figure 6E:
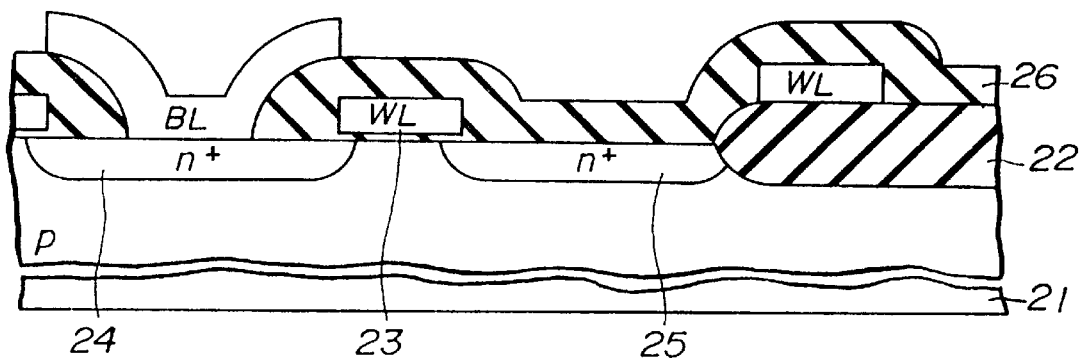

Referring to FIG. 6E, a polysilicon layer is grown to, for example, 500 angstroms on the entire surface by CVD. Then, As ions are introduced into the polysilicon layer by an ion implantation process in which the dose of As ions is equal to $1×10^{15}$ atoms/cm$^2$. After that, a $WSi_2$ film is formed to, for example, 500 angstroms on the impurity doped polysilicon layer by CVD. Then, the $WSi_2$ layer and the impurity doped polysilicon layer are patterned by an RIE process using a $CCl_4/O_2$ gas, so that a bit line BL having a two-layer structure is formed.

Figure 6F:
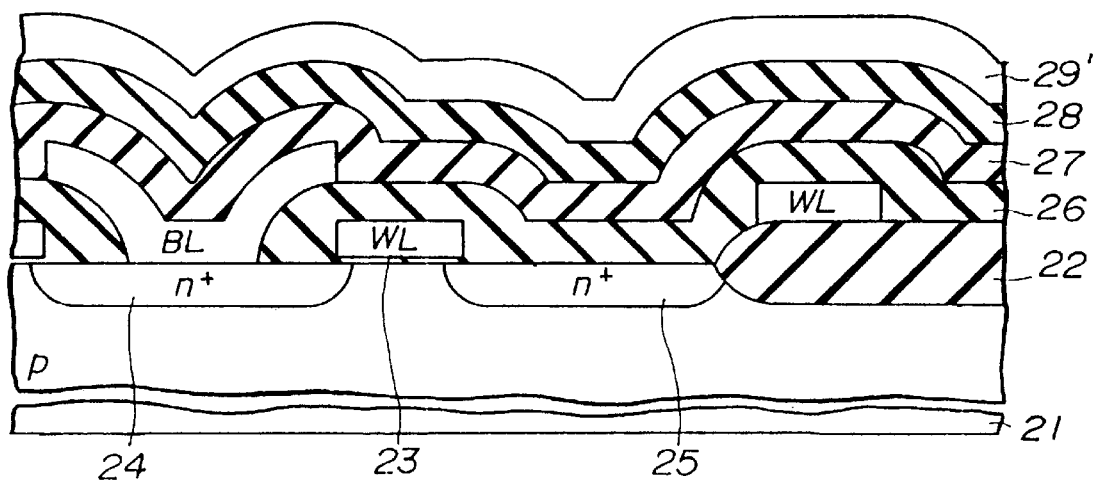

As shown in FIG. 6F, an insulating layer 27 formed of $Si_3N_4$, a spacer layer 28 formed of $SiO_2$ and a polysilicon layer 29' which forms a part of a storage electrode (fin electrode) of a stacked capacitor are grown in this order by CVD. The $Si_3N_4$ insulating layer 27, the $SiO_2$ spacer layer 28 and the polysilicon layer 29' are, for example, 1000, 500 and 1000 angstroms, respectively. It will be noted that the polysilicon layer 29' plays the important role, as will be described later.

Figure 6G:
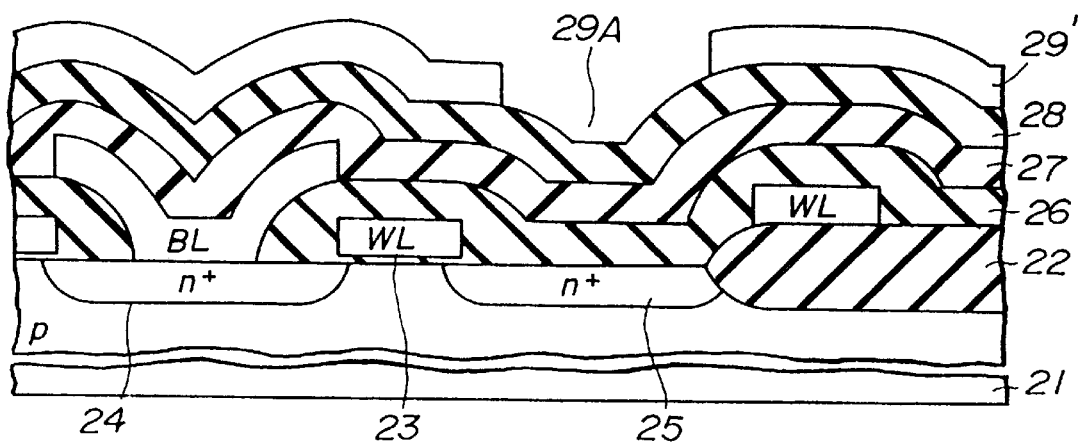

As shown in FIG. 6G, the polysilicon layer 29' is selectively etched by the resist process and RIE process using a $CCl_4/O_2$ gas in the conventional photolithography technique, so that an opening 29A having the same pattern as the storage electrode contact window is formed in the polysilicon layer 29'. During the selective etching process, it is preferable to remove a part of the polysilicon layer 29' on the scribe area in the chip peripheral region. The opening 29A has a width approximately equal to 0.5 $\mu$m, which is the scale limit attained by the conventional photolithography technique.

Figure 6H:
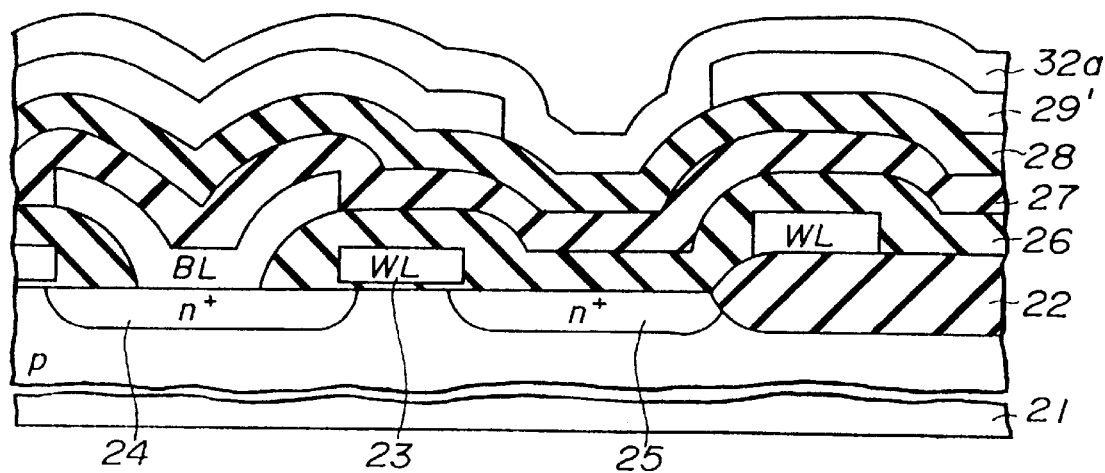
Figure 6I:
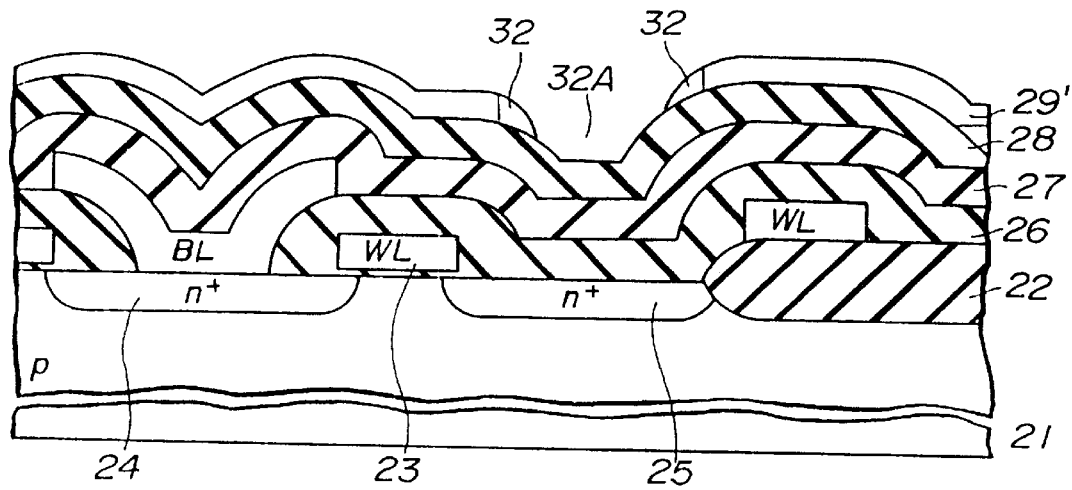

As shown in FIG. 6H, a polysilicon layer 32a is grown to, for example, 1000 angstroms by CVD. Then, as shown in FIG. 6I, the polysilicon layer is anisotropically etched by an RIE process using a $CCl_4/O_2$ gas. Thereby, a sidewall 32 formed of polysilicon around the inner surface of the opening 29A in the polysilicon layer is left on the $SiO_2$ spacer layer 28. The sidewall 32 is approximately 0.1 $\mu$m thick. As a result, the opening 29A is reshaped into an opening 32A having a width of about 0.3 $\mu$m. This dimension of the reshaped opening 29A is smaller than the scale limit by the conventional photolithography technique.

The polysilicon layer 29' and the polysilicon sidewall 32 function as masks when the underlying insulating layers are etched to form the storage electrode contact window. It should be noted that there is no special limitation on the formation of the polysilicon layer 29' and the polysilicon sidewall 32, since they are formed of polysilicon. It should also be noted that the polysilicon layer 29' and the polysilicon sidewall 32 are not removed during a subsequent process, and are utilized as parts of the storage electrode of the stacked capacitor, as will be described in detail later.

Figure 6J:
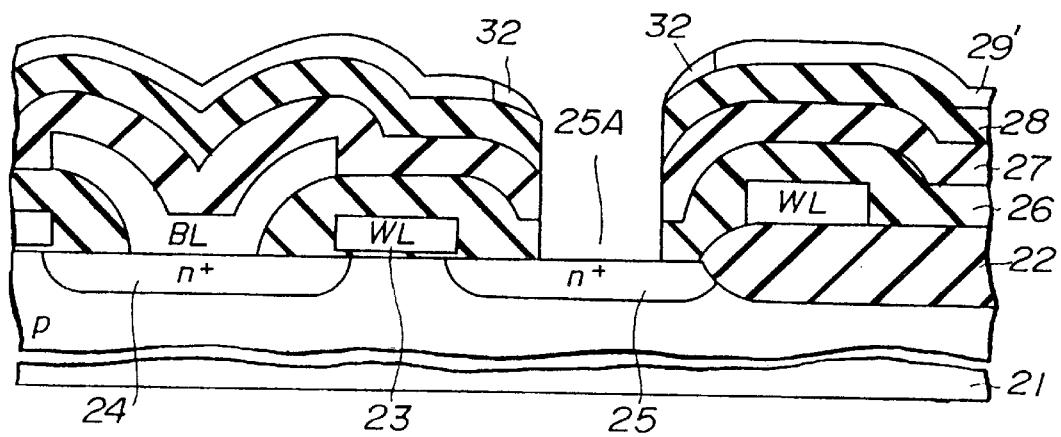

As shown in FIG. 6J, the $SiO_2$ spacer layer 28, the $Si_3N_4$ insulating layer 27, the $SiO_2$ insulating layer 26 and the $SiO_2$ gate insulating layer 23 are selectively etched by an RIE process in which a $CHF_3/H_2$ is used and the polysilicon layer 29' and the polysilicon sidewall 32 function as the etching masks. By the RIE process, a storage electrode contact hole 25A is formed in the above-mentioned layers, so that the n⁺-type drain region 25 is partially exposed.

Figure 6K:
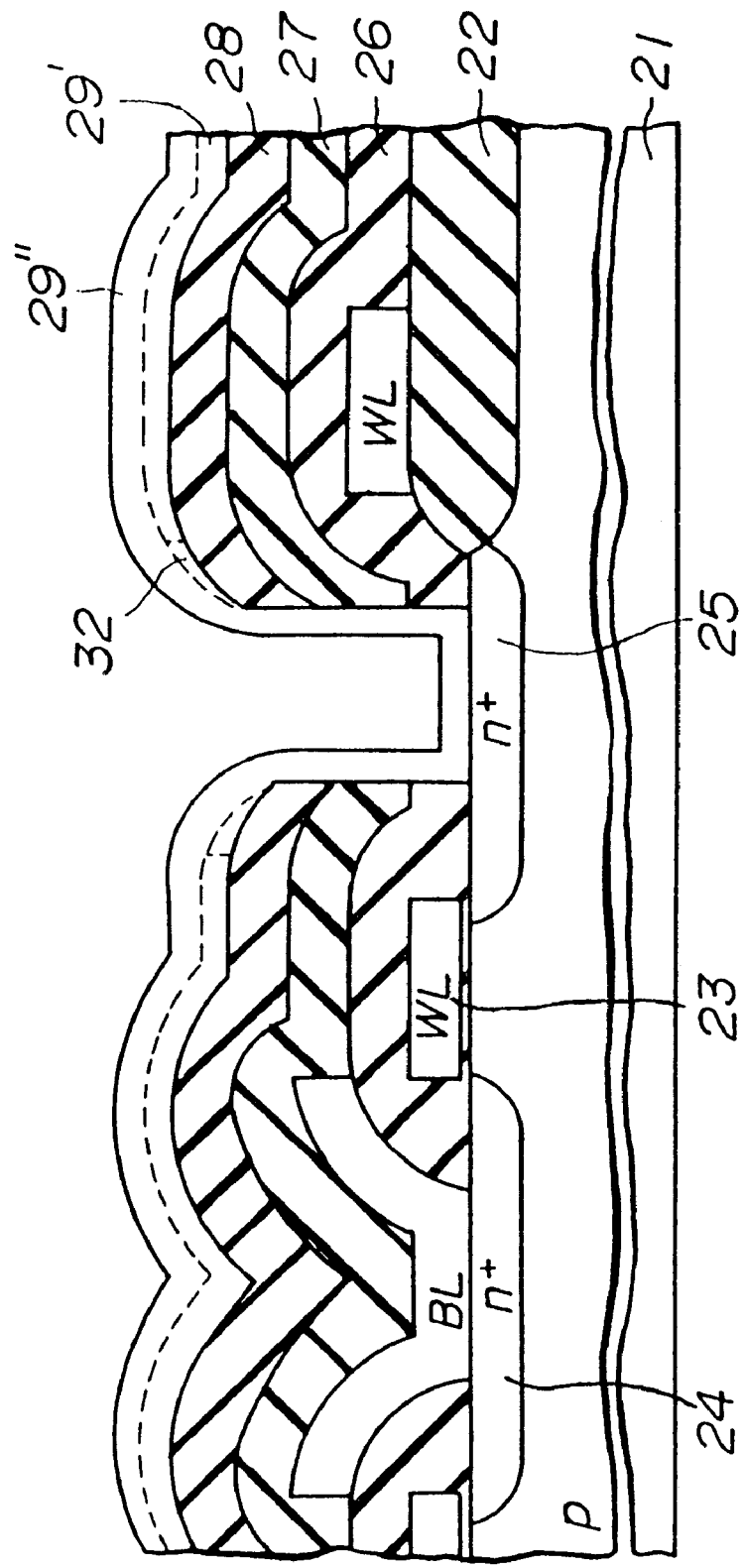

As shown in FIG. 6K, a polysilicon layer 29" is grown to, for example, 500 angstroms by CVD. A part of the polysilicon layer 29" completely covers the inner wall of the storage electrode contact window 25A and the exposed surface of the n⁺-type drain region 25. It is important to form the polysilicon layer 29" in total contact with the $Si_3N_4$ insulating layer 27. Then, As ions are introduced into the polysilicon layers 29" and 29' by an ion implantation process in which the dose of the As ions is equal to, for example, $8 \times 10^{15}$ atoms/cm². By this ion implantation process, each of the polysilicon layers 29" and 29' has a reduced resistance. It will be noted toat the layers consisting of the polysilicon layers 29' and 29" and the sidewall 32 is thicker than the vertically extending portion of the polysilicon layer 29".

Figure 6L:
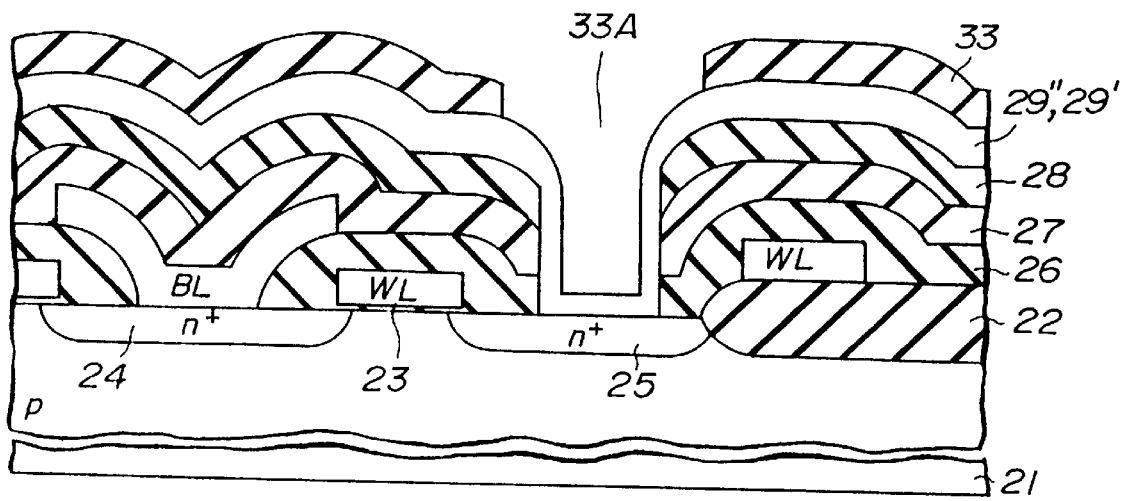

Referring to FIG. 6L, a spacer layer 33 formed of $SiO_2$ is grown to, for example, 500 angstroms on the entire surface by CVD. After that, the $SiO_2$ spacer layer 33 is selectively etched by the resist process and RIE process using a $CHF_3/H_2$ gas in the conventional photolithography technique. By the RIE process, an opening 33A having a belt shape is formed in the $SiO_2$ spacer layer 33. It is sufficient to form the opening 33A so that it is wider than the storage electrode contact window 25A, because the opening 33A is used for stacking a polysilicon layer (fin) on the integrated polysilicon layer consisting of the layers 29" and 29' and the polisilicon sidewall 32.

Figure 6M:
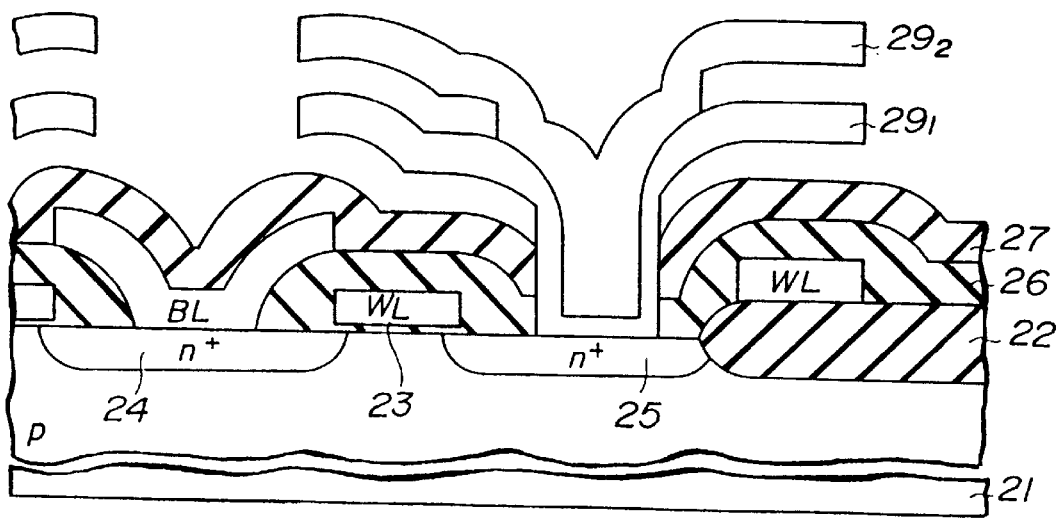

Referring to FIG. 6M, a polysilicon layer is grown to, for example, 1000 angstroms by CVD. After that, As ions are introduced into the polysilicon layer by an ion implantation process in which the dose of As ions is equal to, for example, $1 \times 10^{15}$ atoms/cm². Thereby, the resistance of the polysilicon layer is reduced. After that, the above polysilicon layer, the $SiO_2$ spacer layer 33, and the polysilicon layers 29" and 29' are patterned into an electrode shape by the photoresist process and RIE process using a gas of $CCl_4+O_2$ or $CHF_3+H_2$. Thereafter, the $SiO_2$ spacer layer 33 and the $SiO_2$ spacer layer 28 are completely removed by an etching process in which the device is placed in an HF etchant. Thereby, polysilicon fins $29_2$ and $29_1$ forming a storage electrode 25 of the stacked capacitor are formed. The fin $29_2$ has a bottom contact area wider than the contact hole 25A shown in FIG. 6J.

As has been described previously, the wall of the $Si_3N_4$ insulating layer 27 which is a part of the storage electrode contact window 25A completely makes contact with the polysilicon layer 29', so that there is no possibility that the $SiO_2$ insulating layer 26 and the $SiO_2$ interlayer isolation insulating layer 22 are damaged.

Figure 6N:
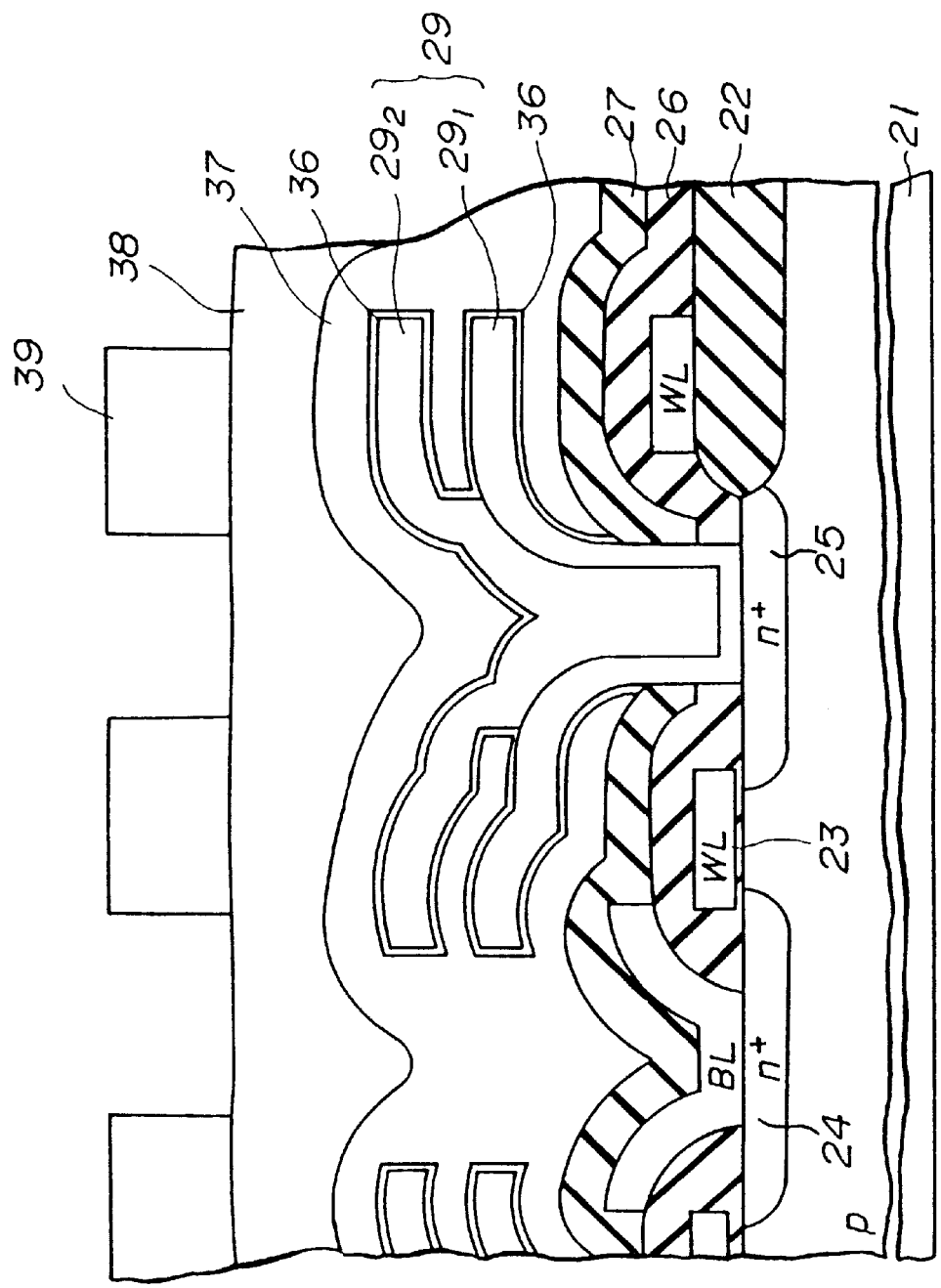
Figure 7:
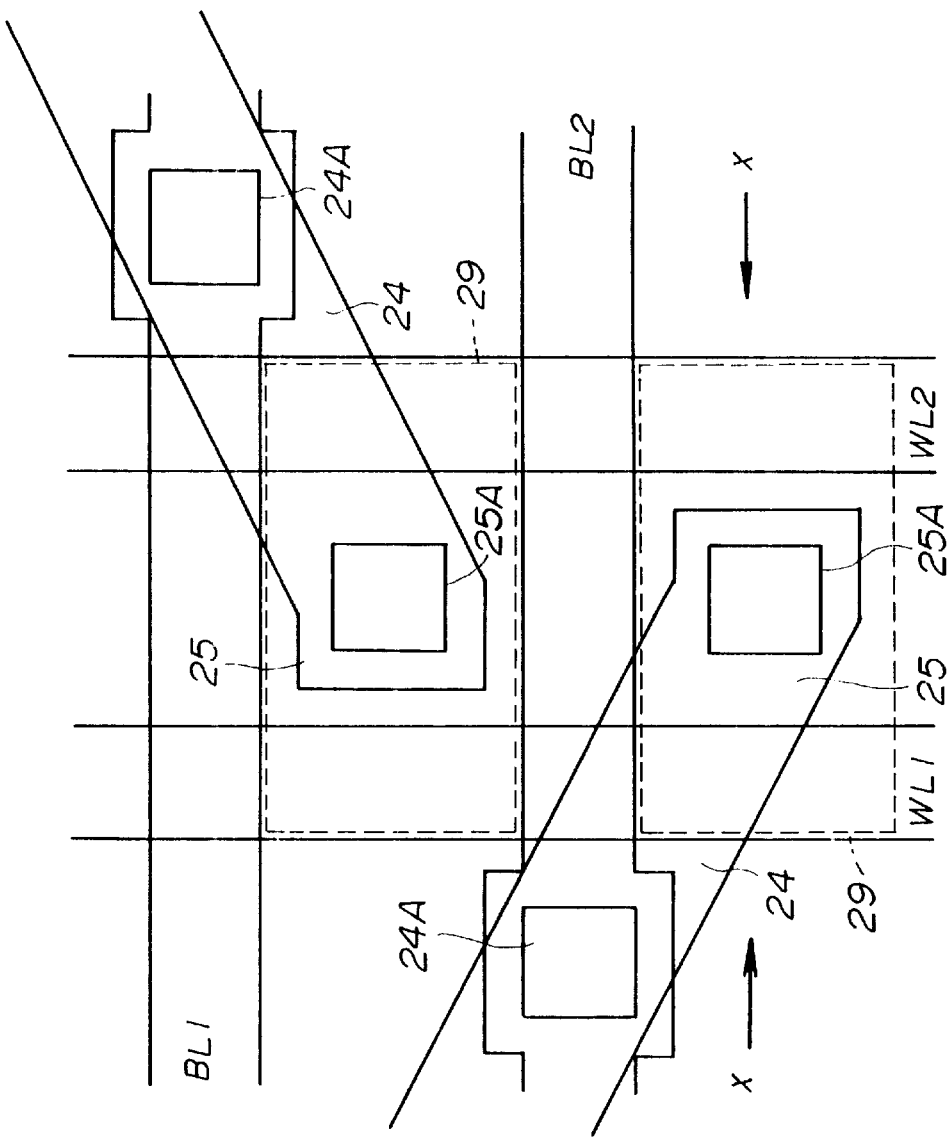
FIG. 7 is a plan view of a DRAM produced by the sixth preferred embodiment of the present invention.

After that, as shown in FIG. 6N, a dielectric film 36 around an exposed surface of the storage electrode 29 is formed, and a cell plate 37 (opposed electrode) is formed so that it covers the entire surface. The dielectric film 36 is formed of, for example, $Si_3N_4$. The stacked capacitor is made up of the storage electrode 29, the dielectric film 36 and the cell plate 37. Then, a PSG layer 38 is formed on the entire surface, and word-line shunt layers 39 formed of, for example, an Al alloy, are formed on the PSG layer 38. FIG. 7 is a plan view of the DRAM fabricated by the above-mentioned production process. In FIG. 7, WL1 and WL2 indicate word lines, and BL1 and BL2 indicate bit lines.

The word-line shunt layers 39 are connected to the corresponding word lines WL via contact holes (not shown for the sake of simplicity). It is preferable to form such contact holes by the aforementioned first through fifth embodiments of the present invention.

It can be seen from FIG. 6K that the lowermost polysilicon fin $29_1$ has the sidewall 32, and the polysilicon layers 29' and 29". The polysilicon layer 29" is thicker than the polysilicon layer 29', and the largest thickness of the sidewall 32 is approximately equal to the thickness of the polysilicon layer 29'.

Figure 8A:
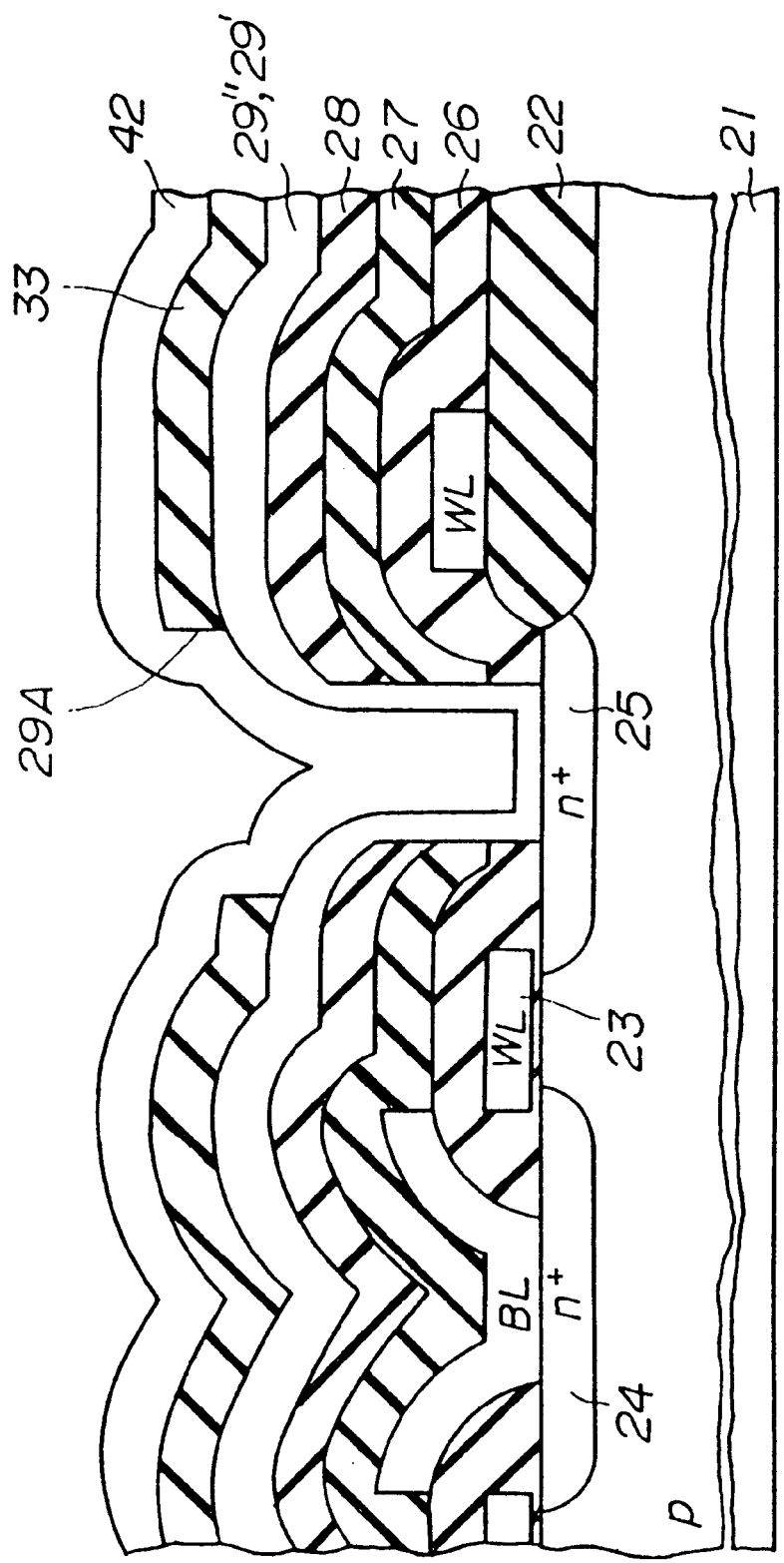
FIGS. 8A through 8E are cross-sectional views showing a seventh preferred embodiment of the present invention.

A description will now be given of an eighth embodiment of the present invention with reference to FIGS. 8A through 8E, in which those parts which are the same as those shown in the previous figures are given the same reference numerals. The eighth embodiment of the present invention utilizes the steps which have been described with reference to FIGS. 6A through 6L. After the step related to FIG. 6L, a step shown in FIG. 8A is carried out. A polysilicon layer is grown to, for example, 1000 angstroms on the entire surface.

Figure 8B:
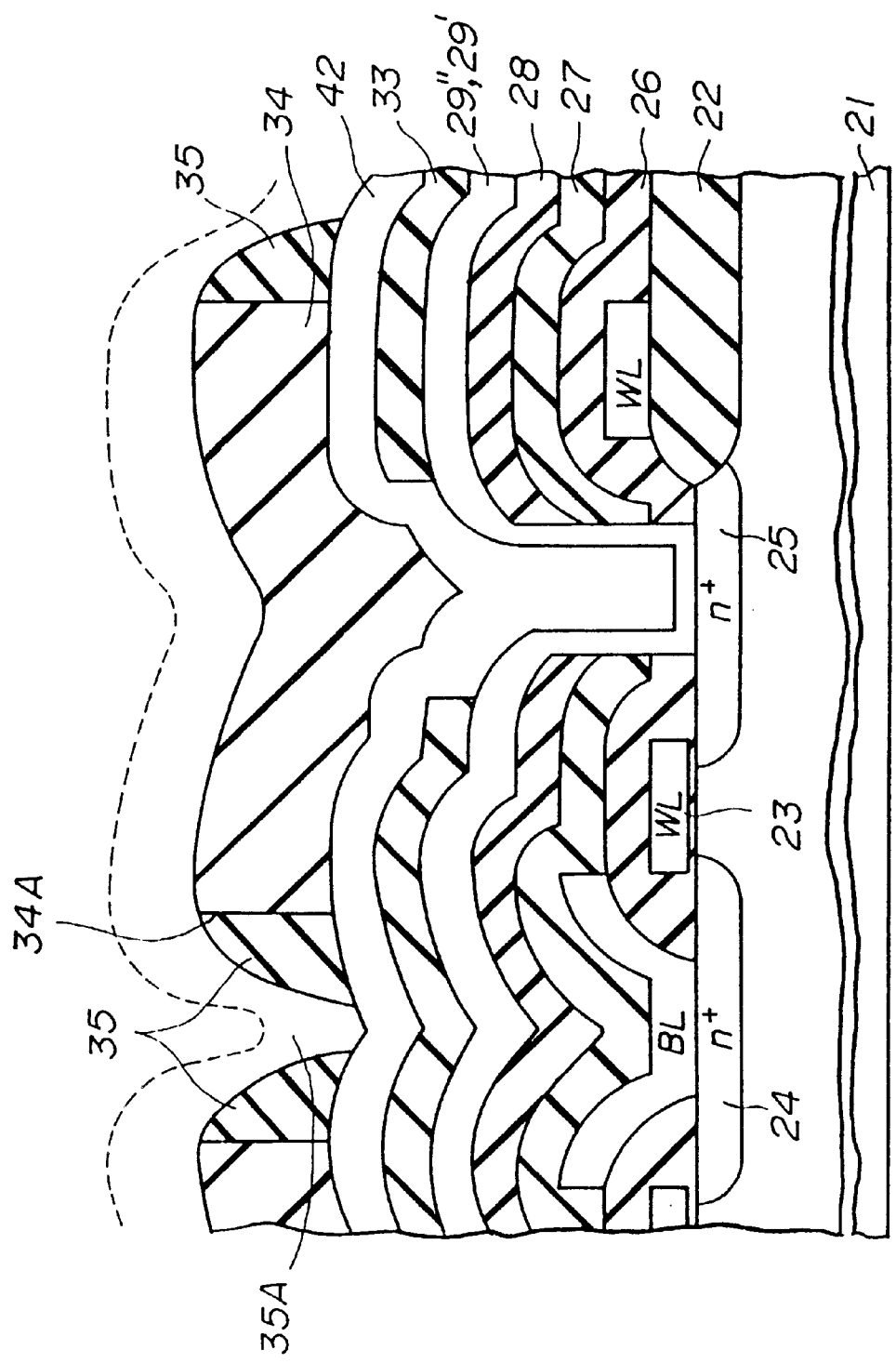

After that, as shown in FIG. 8B, an insulating layer 34 formed of $SiO_2$ is grown to, for example, 2000 angstroms by CVD. Then, the $SiO_2$ insulating film 34 is patterned into the shape of the storage electrode by the resist process and RIE process using a $CHF_3/H_2$ gas in the photolithography technique, so that openings are formed in the $SiO_2$ insulating film 34. Each of the openings is approximately 0.5 μm wide, which corresponds to the scale limit of the conventional photolithography technique.

Then, an insulating layer 35 formed of $SiO_2$ is grown to, for example, 1000 angstroms on the entire surface by CVD. Thereafter, the $SiO_2$ insulating layer 35 is anisotropically etched by an RIE process using a $CHF_3$ and $H_2$ gas. Thereby, sidewalls 35 are formed around inner walls of the openings in the $SiO_2$ layer 34, and the rest thereof is removed. Each sidewall 35 defines an opening 35A having a width approximately equal to 0.3 μm, which is smaller than the scale limit of the conventional photolithography technique.

Figure 8C:
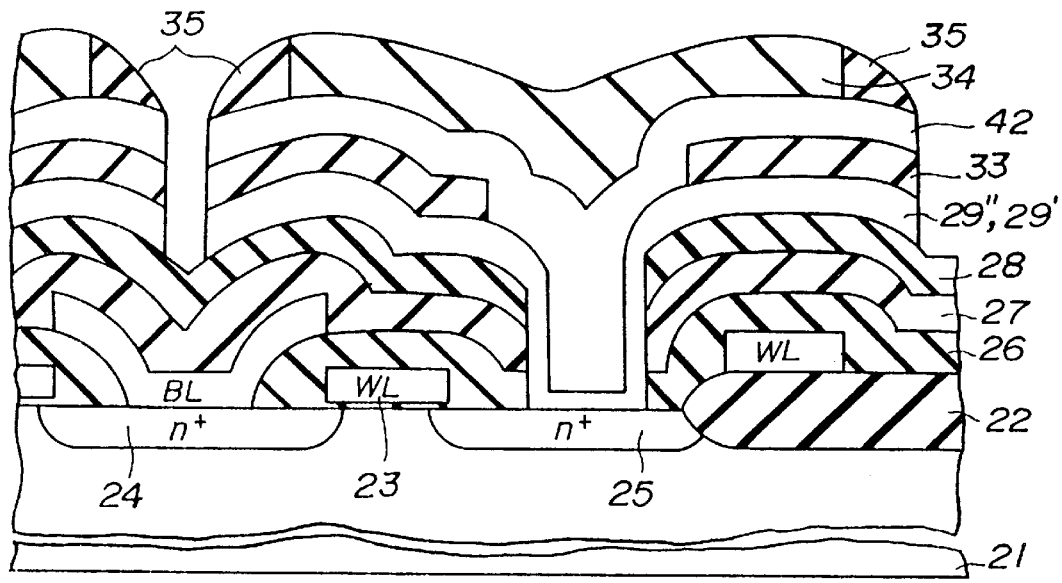

Then, as shown in FIG. 8C, the polysilicon layer 42, the $SiO_2$ spacer layer 33, and the polysilicon layers 29" and 29' are patterned into the shape of the storage electrode by an RIE process in which a $CHF_3/H_2$ gas is used and the $SiO_2$ insulating layer 34 and the $SiO_2$ sidewalls 15 function as etching masks. It should be noted that the distance between opposite portions of the polysilicon layer 42 is approximately 0.3 μm. Similarly, the distance between opposite portions of the polysilicon layer consisting of the polysilicon layer 29" and 29' is also approximately 0.3 μm. This means that the adjacent storage electrodes are very close to each other, and thus the surface area of each storage electrode is increased, so that each stacked capacitor can have an increased capacitance.

Figure 8D:
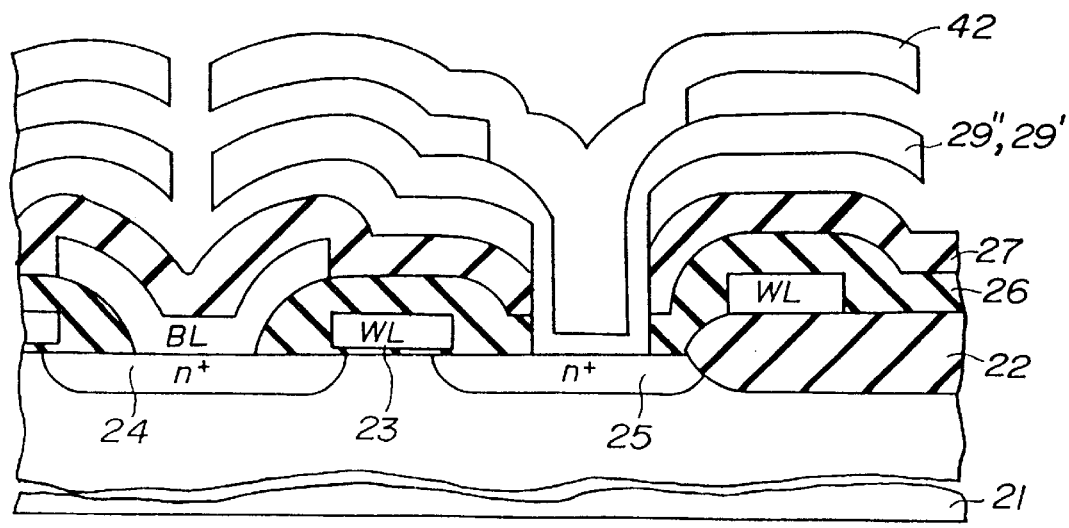

It will be noted that during etching of the $SiO_2$ spacer layer 33, the $SiO_2$ insulating layer 34 and the $SiO_2$ sidewalls 35 serving as etching masks are also etched. From this point of view, it is necessary for the layer 34 and the sidewalls 35 to have a sufficient thickness. Further, a special step to remove the $SiO_2$ insulating layer 34 and the $SiO_2$ sidewalls 35 is not needed because the $SiO_2$ insulating layer 34 and the sidewalls 35 are removed during a subsequent step in which the device is placed in an HF etchant, as shown in FIG. 8D.

Figure 8E:
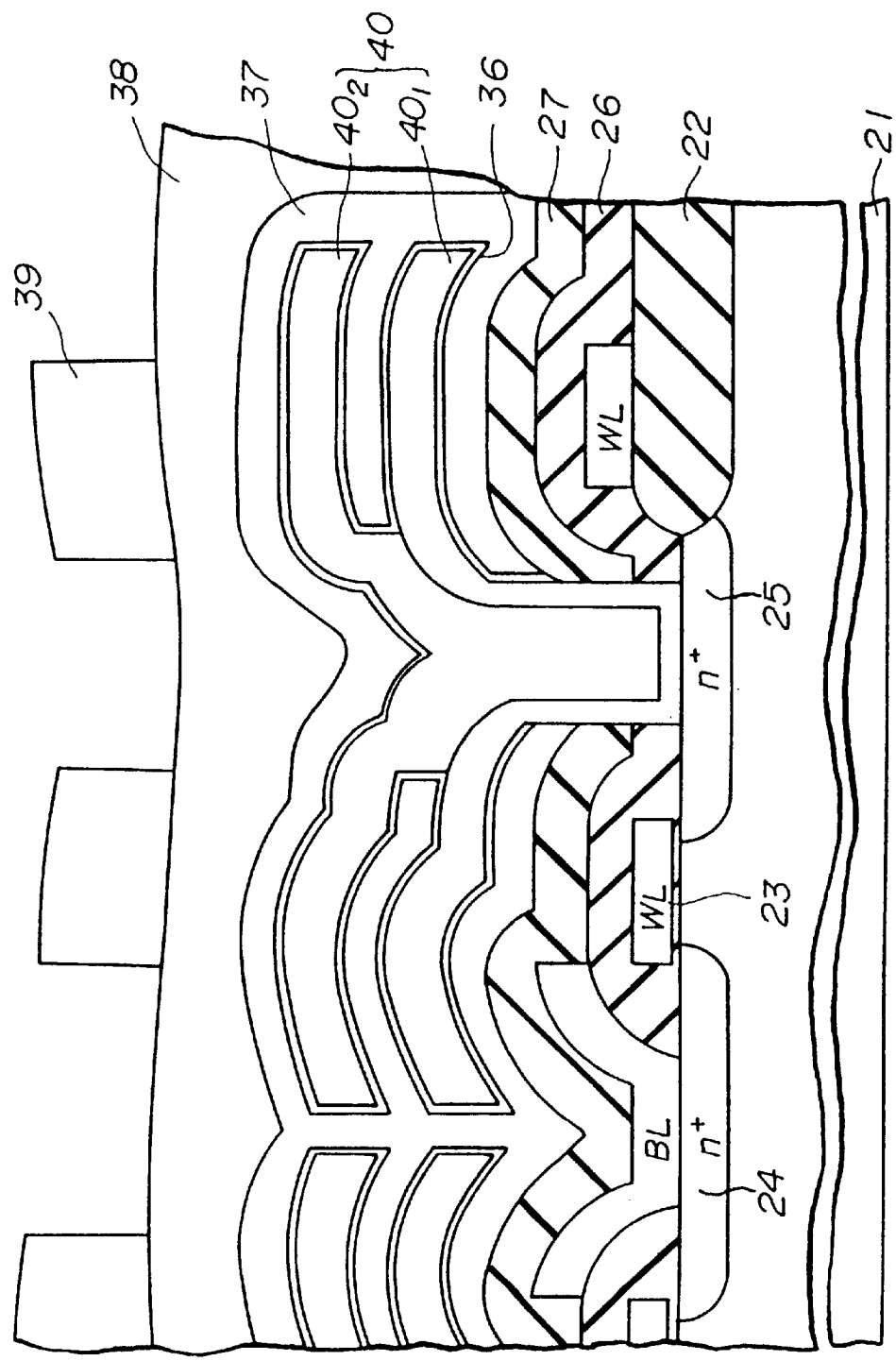

After that, a process identical to that which has been described with reference to FIG. 6N is carried out. FIG. 8E shows a DRAM fabricated according to the seventh preferred embodiment of the present invention. A storage electrode 40 has two stacked polysilicon fins $40_1$ and $40_2$. The polysilicon fin $40_1$ corresponds to the patterned polysilicon layers 29" and 29' and the polysilicon sidewall 32, and the polysilicon fin $40_2$ corresponds to the patterned polysilicon layer 42. It can be seen from FIG. 6N and FIG. 8E that the adjacent stacked capacitors shown in FIG. 8E are closer to each other than those shown in FIG. 6N.

Figure 9A:
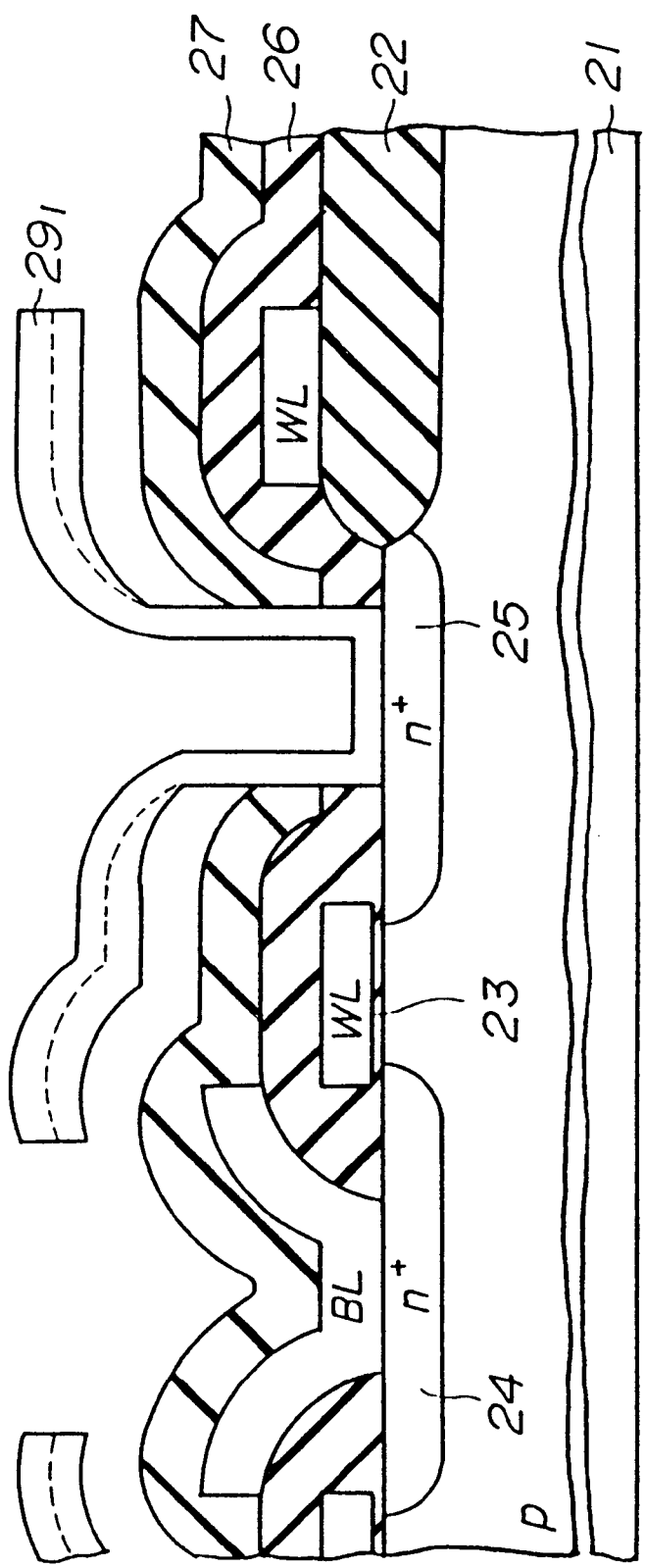
FIGS. 9A and 9B are cross-sectional views showing a first variation of the sixth preferred embodiment of the present invention.
Figure 9B:
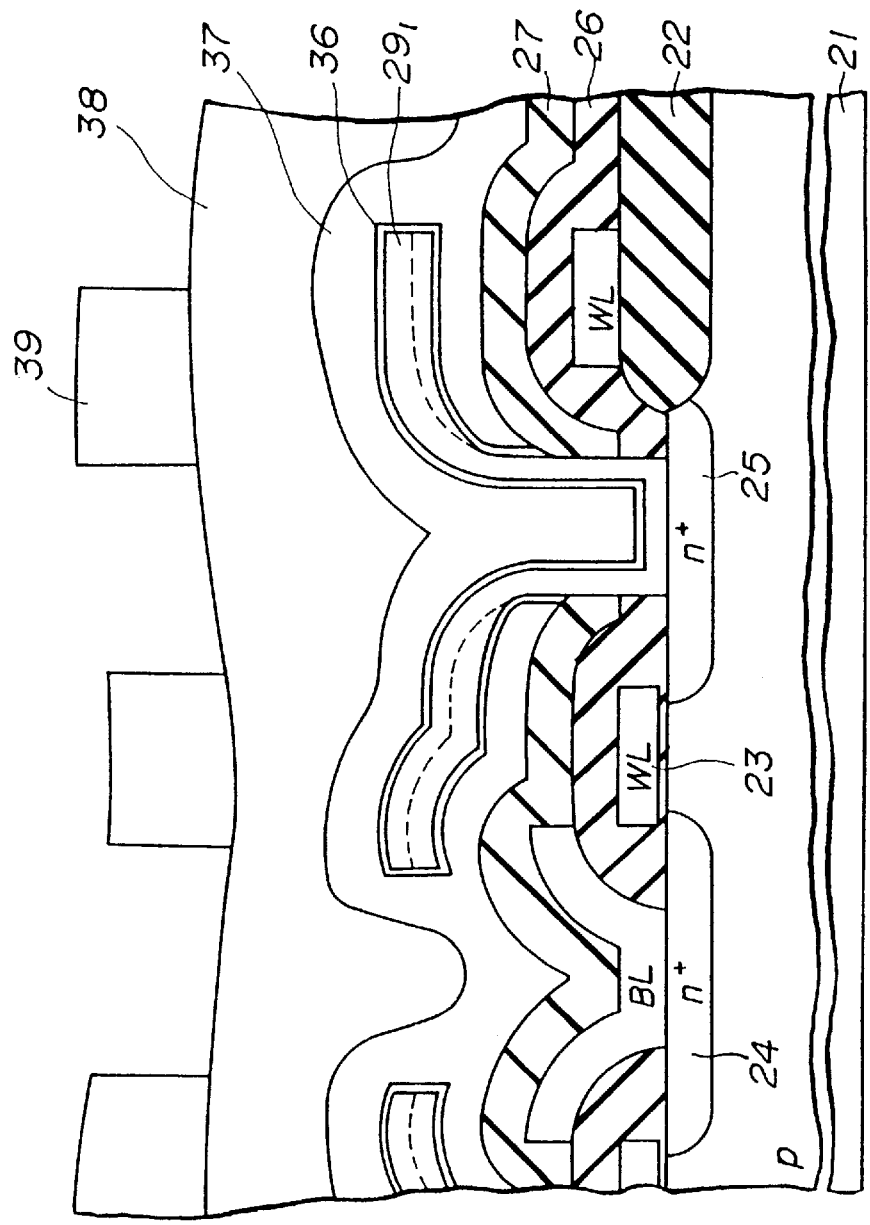

A description will now be given of a first variation of the aforementioned sixth preferred embodiment of the present invention, with reference to FIGS. 9A and 9B, in which those parts which are the same as those shown in the previous figures are given the same reference numerals. The first variation has a storage electrode having only the polysilicon fin $29_1$ which consists of the polysilicon layers 29" and 29' and the polysilicon sidewall 32. After the step which has been described with reference to FIG. 6K, the polysilicon layer consisting of the polysilicon layers 29" and 29' and the polysilicon sidewall 32 is patterned into the shape of the storage electrode. After that, the device is placed in an HF etchant, so that the insulating layer 28 is completely removed, as shown in FIG. 9A. Then, the process which has been described previously with reference to FIG. 6N is carried out, so that a DRAM shown in FIG. 9B can be obtained. It is noted that the insulating layer 27 can be formed of $SiO_2$ or $Si_3N_4$. As shown in FIG. 9B, the fin $29_1$ is thicker than a vertically extending portion of the storage electrode.

Figure 10:
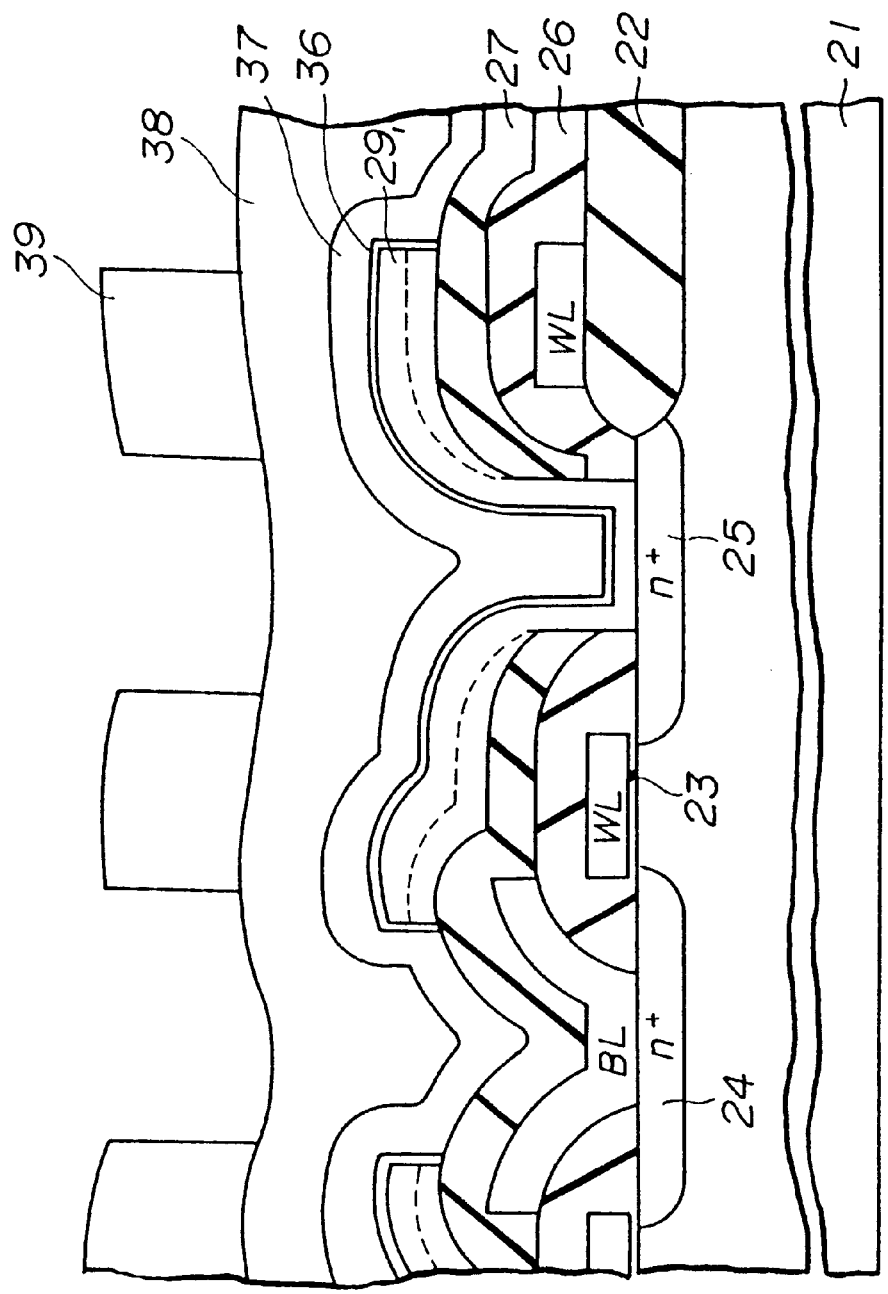
FIG. 10 is a cross-sectional view showing a second variation of the sixth preferred embodiment of the present invention.

FIG. 10 illustrates a second variation of the aforementioned sixth preferred embodiment of the present invention. In FIG. 10, those parts which are the same as those shown in the previous figures are given the same reference numerals. The polysilicon fin $29_1$ consisting of the polysilicon layers 29" and 29' and the polysilicon sidewall 32 is formed directly on the insulating layer 27 formed of $SiO_2$ or $Si_3N_4$. The polysilicon layer 29' shown in FIG. 6F is grown on the insulating layer 27 without forming the insulating layer 28. Then, the same steps as has been described with reference to FIGS. 6G through 6K and FIG. 6N are carried out. It is also possible to form the polysilicon fin $29_2$ on the polysilicon fin $29_1$ in the same way as has been described with reference to FIGS. 6L and 6M.

A description will now be given of an eighth preferred embodiment of the present invention with reference to FIGS. 11A through 11J, in which those parts which are the same as shown in the previous figures are given the same reference numerals. A structure shown in FIG. 11B is the same as that shown in FIG. 6E. Steps to obtain the structure shown in FIG. 11B are the same as those which have been described with reference to FIGS. 6A through 6E.

Figure 11A:
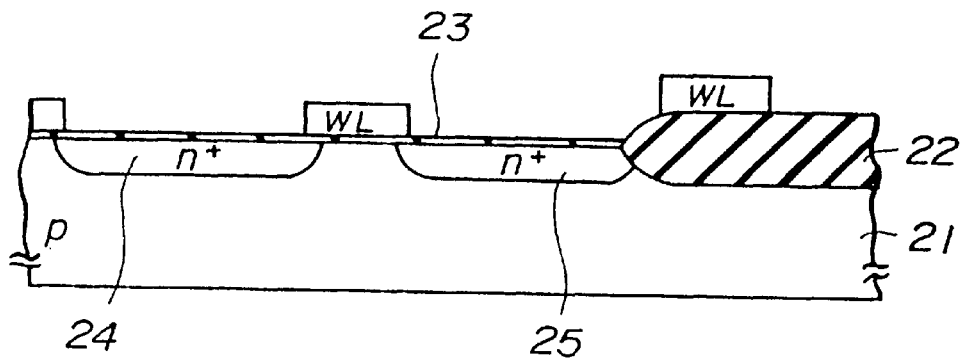
FIGS. 11A through 11J are cross-sectional views showing an eighth preferred embodiment of the present invention.
Figure 11B:
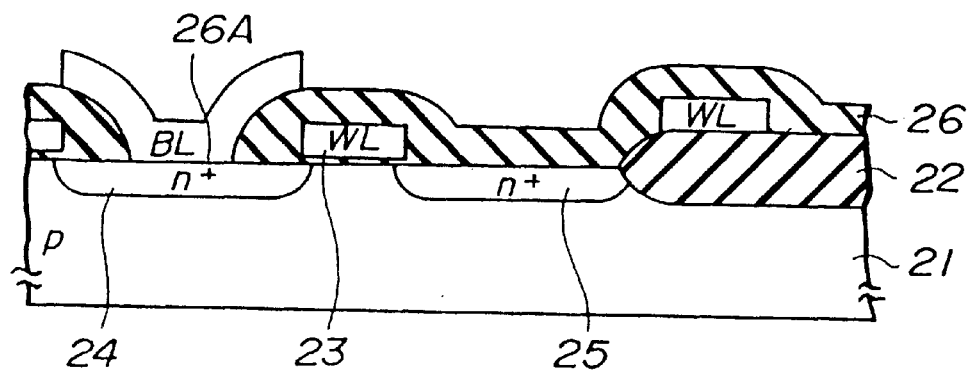
Figure 11C:
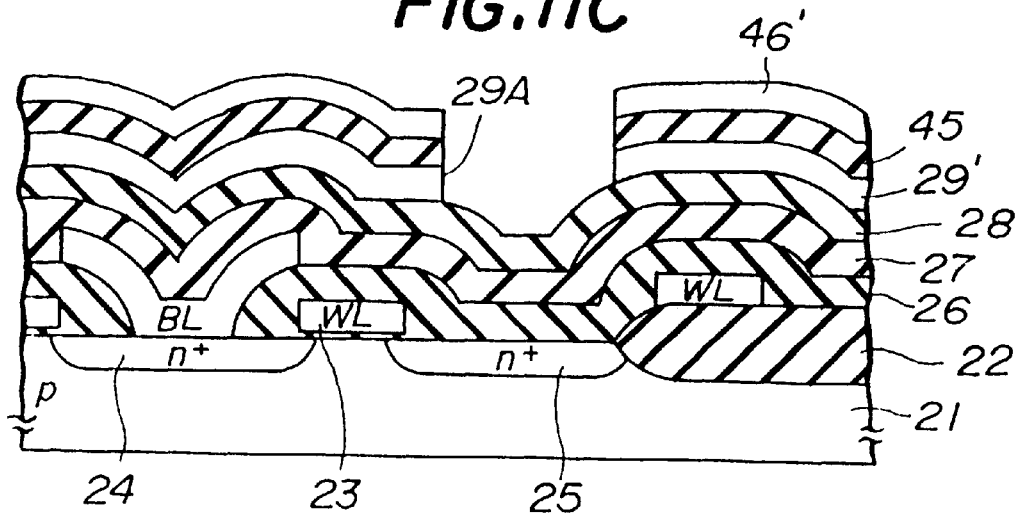

As shown in FIG. 11C, the $Si_3N_4$ insulating layer 27, the $SiO_2$ spacer layer 28, the impurity-doped polysilicon layer 29', a spacer layer 45 formed of $SiO_2$ and an impurity-doped polysilicon layer 46' are formed in this order by CVD. For example, each of these layers is 500 angstorms thick. Then, the polysilicon layer 46', the $SiO_2$ spacer layer 45 and the polysilicon layer 29' are selectively etched by the resist process and the RIE process, so that an opening 29A having a thickness equal to, for example, 0.6 $\mu$m is formed therein. During the above RIE process, a $CCl_4/O_2$ gas is used for the polysilicon layers 46' and 29', and a $CHF_3/He$ gas is used for the $SiO_2$ spacer layer 45.

Figure 11D:
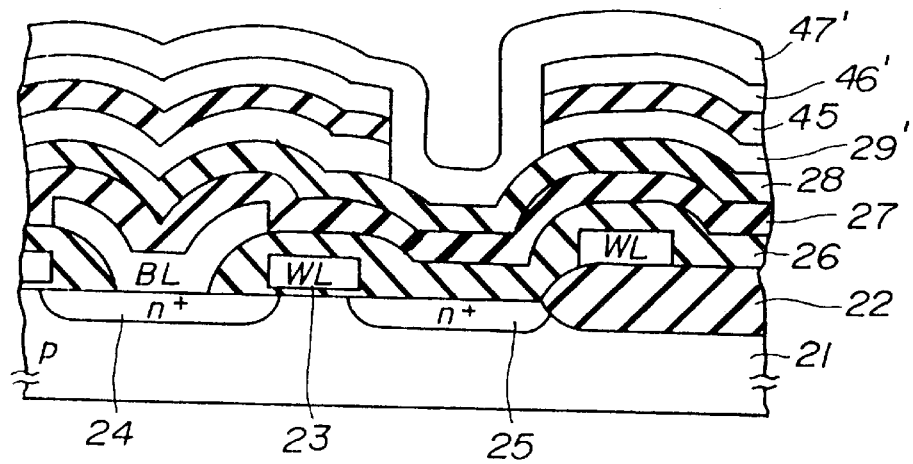
Figure 11E:
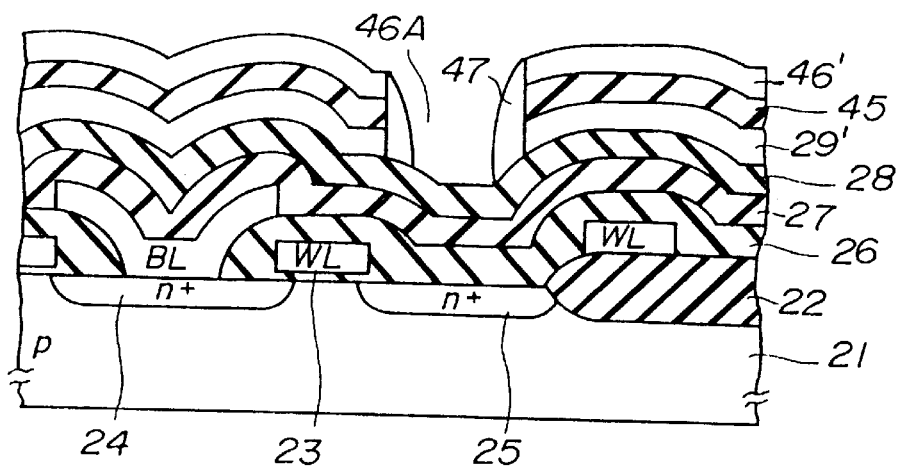

As shown in FIG. 11D, a polysilicon layer 47' is grown to, for example, 2000 angstorms on the entire surface by CVD. After that, as shown in FIG. 11E, the polysilicon layer 47' is anisotropically etched by an RIE process in which a $CCl_4/O_2$ gas or an HBr/He gas is used. Thereby, a polysilicon sidewall 47 is formed around an inner surface of the opening 29A, and the remaining portion of the polysilicon layer 47' is removed. The sidewall 47 defines a new opening 46A having a width approximately equal to 0.2–0.3 $\mu$m, which is smaller than the width of the opening 29A shown in FIG. 11C.

Figure 11F:
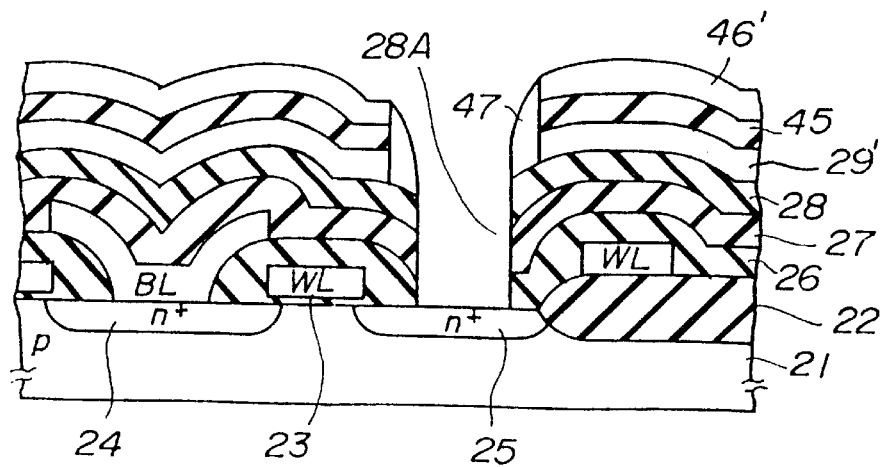

After that, as shown in FIG. 11F, the $SiO_2$ spacer layer 28, the $Si_3N_4$ insulating layer 27, the $SiO_2$ insulating layer 26 and the $SiO_2$ gate insulating layer 23 are partially removed by an RIE process in which a $CHF_3/He$ gas is used and the polysilicon layer 46' and the polysilicon sidewall 47 function as etching masks. By this RIE process, the surface of the $n^+$-type drain region 25 is partially exposed through a contact hole 28A.

It should be noted that the width of the opening 46A is very small and equal to about 0.2–0.3 $\mu$m, and that the polysilicon layer 40' and the polysilicon layer 47 functioning as the etching masks form a part of the storage electrode without being removed. Thus, it is not necessary to provide a special step to remove the polysilicon layer 40' and the polysilicon sidewall 47 functioning the etching masks.

Figure 11G:
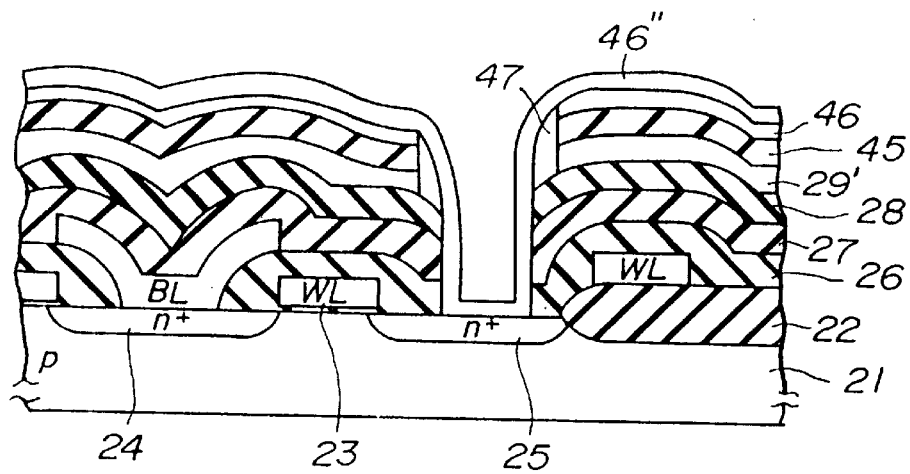

As shown in FIG. 11G, a polysilicon layer 46" is grown to, for example, 500 angstroms by CVD. During this step, the polysilicon layers 46" and 40' as well as the polysilicon sidewall 47 are integrated.

Figure 11H:
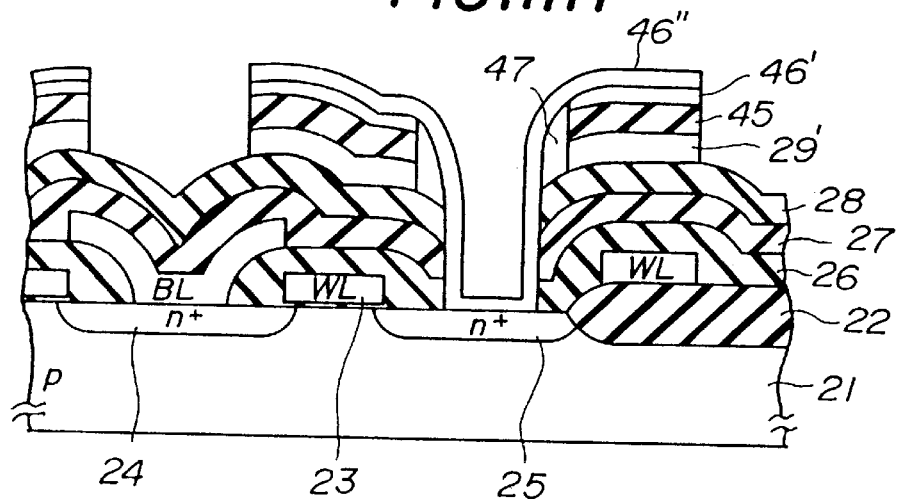

Then, as shown in FIG. 11H, the polysilicon layers 46" and 46', the $SiO_2$ spacer layer 45, and the polysilicon layer 29' are patterned into the shape of the storage electrode in this order by the resist process using a single mask and the RIE process in the conventional photolithography process.

Figure 11I:
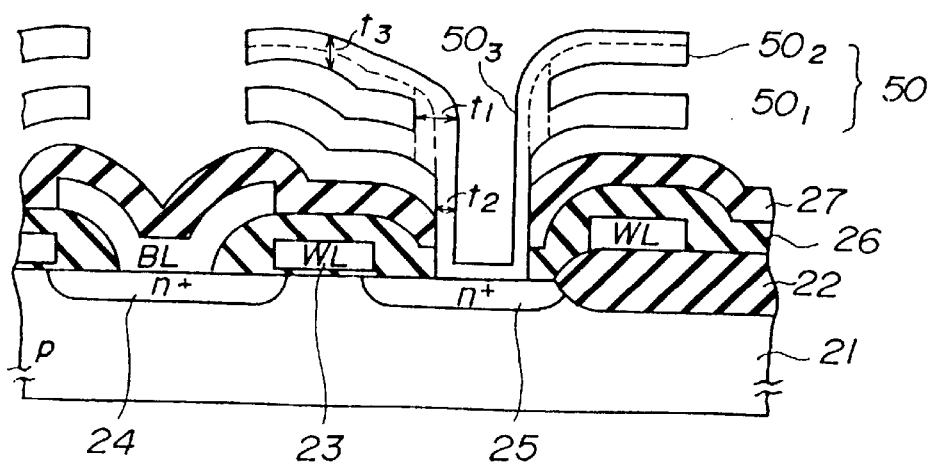

After that, as shown in FIG. 11I, the device shown in FIG. 11H is placed in an HF etchant, so that the exposed $SiO_2$ insulating layers are isotropically etched, so that a storage electrode 50 having two polysilicon fins $50_1$ and $50_2$ is formed. The fin $50_1$ is formed of the patterned polysilicon layer 29', and the fin $50_2$ is formed of the patterned polysilicon layers 46" and 46'. The fins $50_1$ and $50_2$ are connected by the polysilicon sidewall 47. The polysilicon layer 46" which is a part of the fin $50_2$ vertically extends from its portion on the polysilicon layer 40' and makes contact with the $n^+$-type drain region 25. A vertical portion $50_3$ of the storage electrode 50 consists of the polysilicon sidewall 47 and the polysilicon layer 46". The vertical portion $50_3$, the polysilicon layer 46", and the fin $50_2$ have mutually different thicknesses $t_1$, $t_2$ and $t_3$, respectively. The vertical portion $50_3$ is thicker than the polysilicon layer 46" and the fin $50_2$.

Figure 11J:
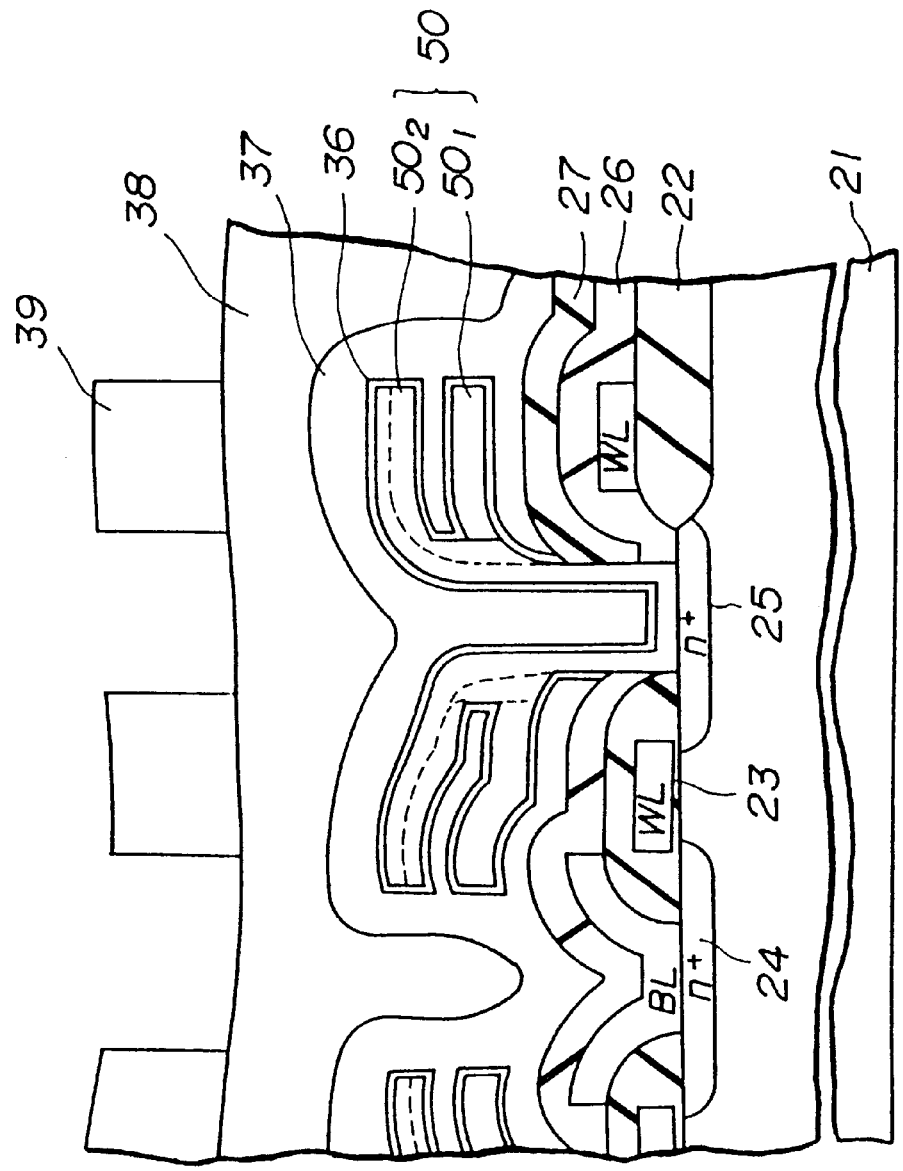

Finally, as shown in FIG. 11J, the dielectric film 36, the cell plate 37, the PSG passivation layer 38 and the word-line shut layers 39 are formed in the same way as has been described with reference to FIG. 6N.

A description will now be given of a ninth preferred embodiment of the present invention with reference to FIGS. 12A through 12G, in which those parts which are the same as those shown in the previous figures are given the same reference numerals.

Figure 12A:
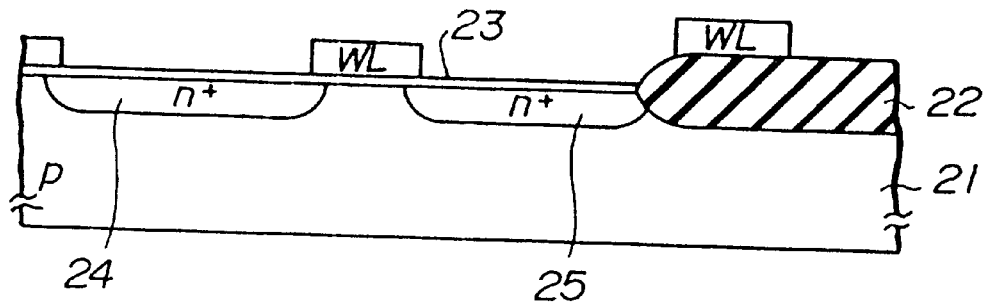
FIGS. 12A through 12G are cross-sectional views showing a ninth preferred embodiment of the present invention.
Figure 12B:
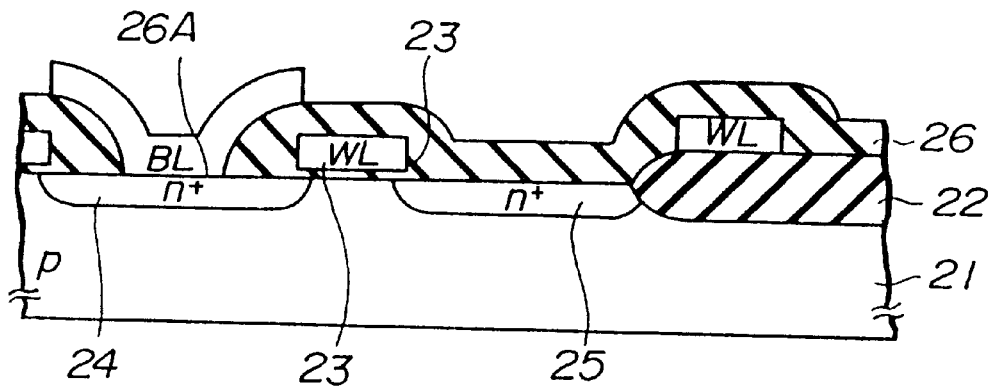
Figure 12C:
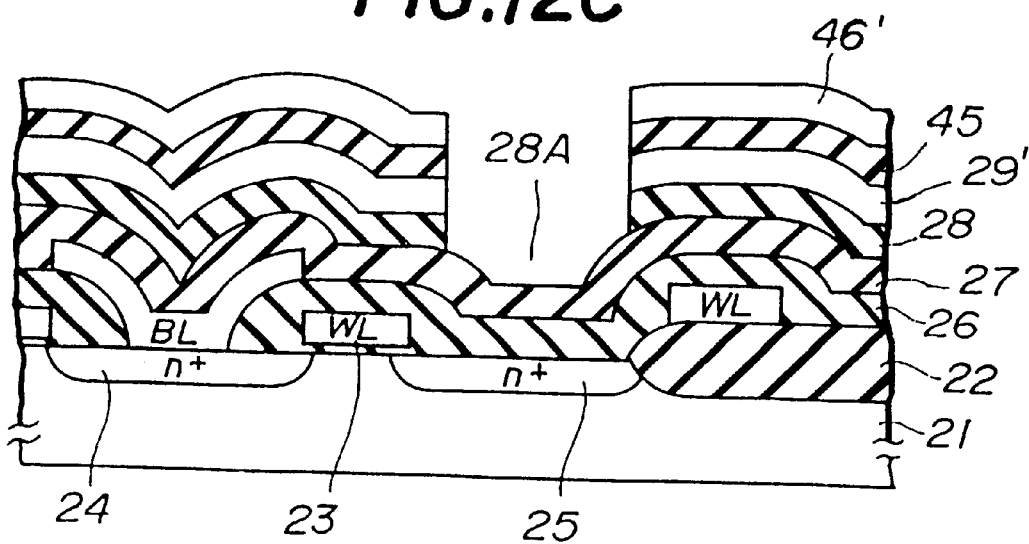

Production steps shown in FIGS. 12A and 12B are carried out in the same way as those shown in FIGS. 11A and 11B. After that, as shown in FIG. 12C, the $Si_3N_4$ insulating layer 27, the $SiO_2$ spacer layer 28, the impurity-doped polysilicon layer 29', the $SiO_2$ spacer layer 45 and the impurity-doped polysilicon layer 46' are formed in this order by CVD. Each of these layers is 500 angstroms thick, for example. Then, the polysilicon layer 46', the $SiO_2$ spacer layer 45, the polysilicon layer 29' and the $SiO_2$ spacer layer 28 are selectively etched by the resist process and RIE process, so that an opening 28A is formed therein. It will be noted that the $SiO_2$ layer 28 is etched as shown in FIG. 12C, while the $SiO_2$ layer 28 shown in FIG. 11C is not etched.

Figure 12D:
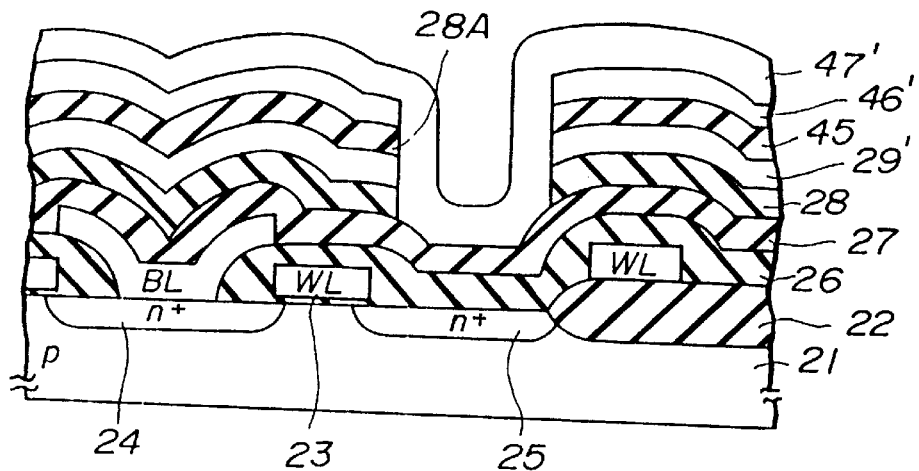
Figure 12E:
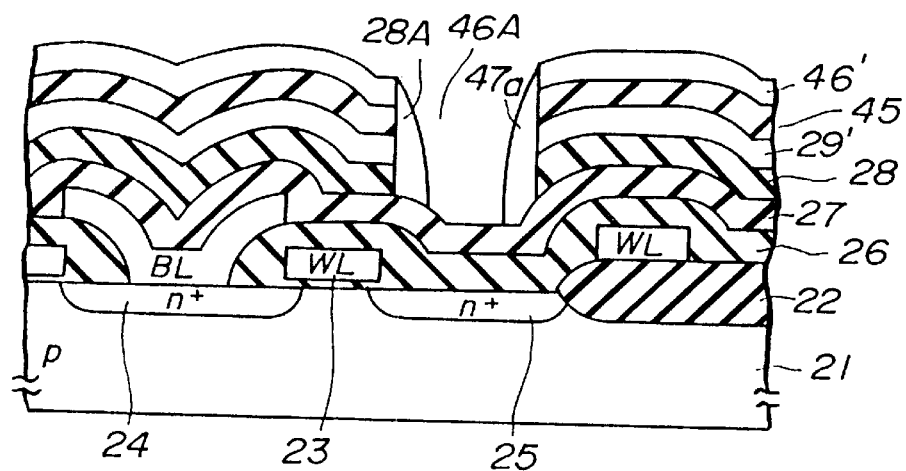

After that, as shown in FIG. 12D, a polysilicon layer 47' is grown to, for example, 2000 angstorms by CVD. After that, as shown in FIG. 12E, the polysilicon layer 47' is selectively etched by an RIE process using a $CCl_4/O_2$ gas, so that a polysilicon sidewall 47a is formed so that it surrounds the inner wall of the opening 28A. The remaining portion of the polysilicon layer 47' is completely removed. The polysilicon sidewall 47a defines a new opening 46A narrower than the opening 28A.

Figure 12F:
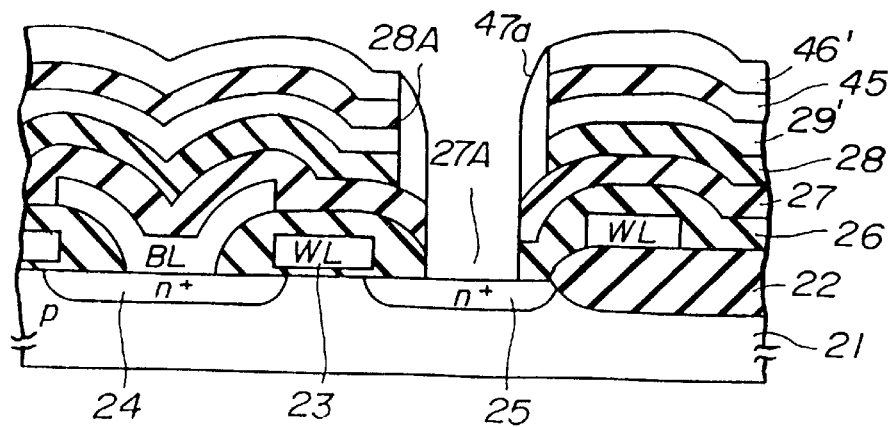

Subsequently, as shown in FIG. 12F, the $Si_3N_4$ insulating layer 27, the $SiO_2$ insulating layer 26 and the $SiO_2$ gate insulating layer 23 are selectively etched by an RIE process in which a $CHF_3/He$ gas is used and the polysilicon layer 40' and the sidewall 47a function as etching masks. By this RIE process, the surface of the $n^+$-type drain region 25 is partially exposed through a through hole 27A having the same width as the opening 46A. After that, the aforementioned production steps are carried out, so that a DRAM shown in FIG. 12G can be obtained.

Figure 12G:
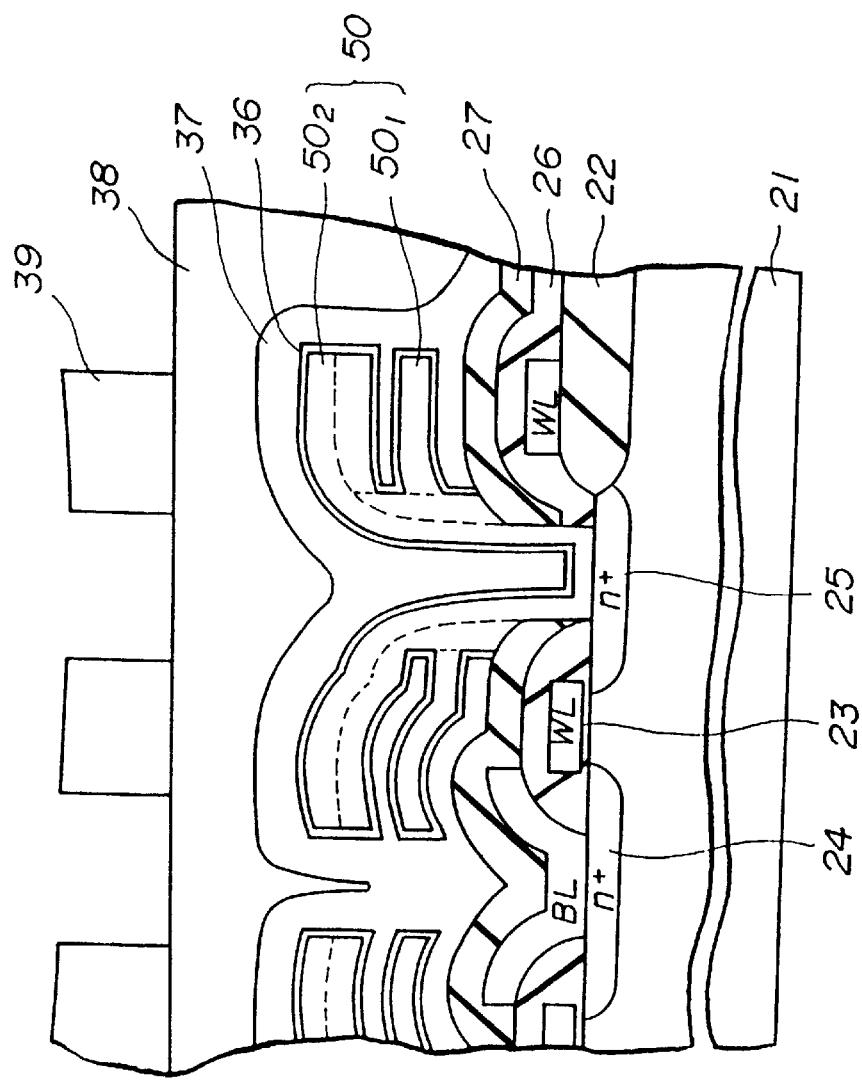

The length of the sidewall 37a used in the ninth embodiment of the present invention is greater than that of the sidewall 37 used in the eighth embodiment of the present invention. Thus, the sidewall 47a functions as the mask more stably than the sidewall 47. On the other hand, the distance between the sidewall 37a and the word line WL is closer than the corresponding distance obtained in the eighth embodiment of the present invention. Thus, the breakdown voltage of the DRAM shown in FIG. 12G is slightly smaller than that of the DRAM shown in FIG. 11J.

Figure 13A:
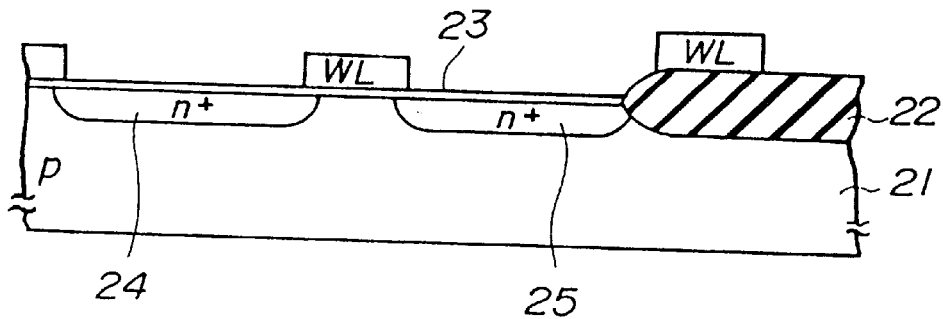
FIGS. 13A through 13F are cross-sectional views showing a variation of the ninth preferred embodiment of the present invention.
Figure 13B:
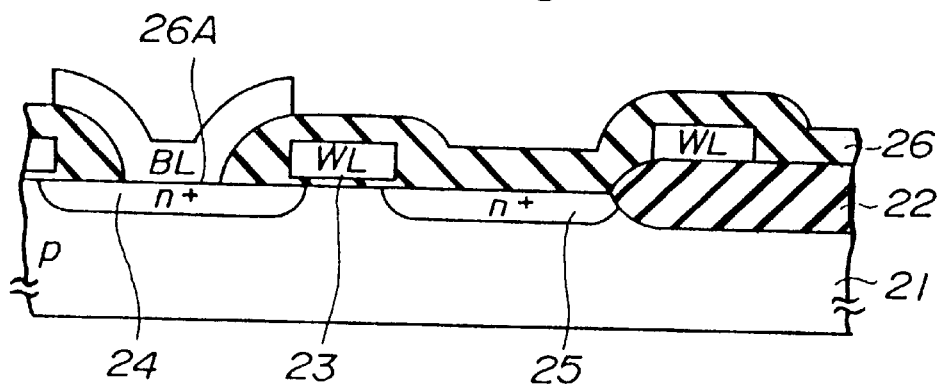
Figure 13C:
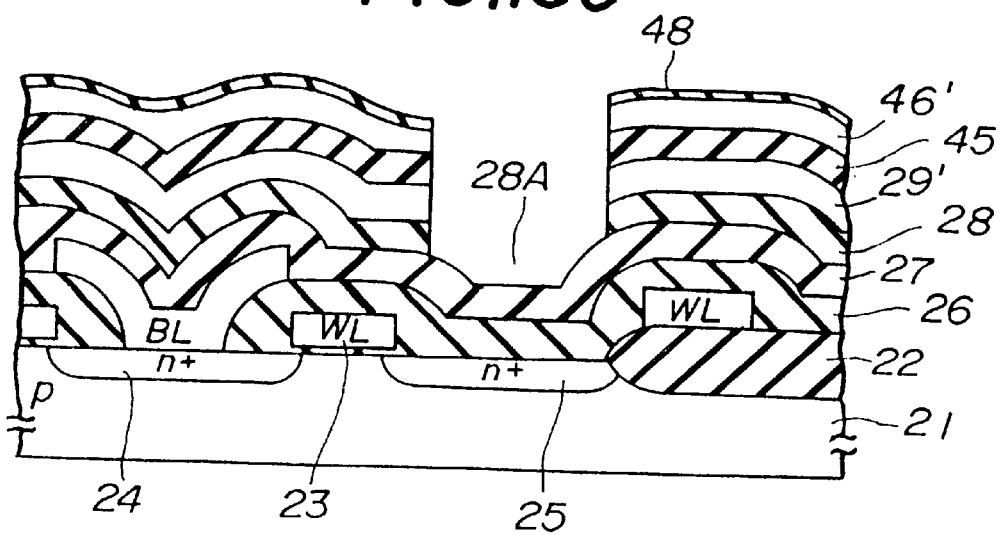

A description will now be given of a variation of the ninth preferred embodiment of the present invention with reference to FIGS. 13A through 13F, in which those parts which are the same as those shown in the previous figures are given the same reference numerals. FIGS. 13A and 13B are the same as FIGS. 11A and 11B. Then, as shown in FIG. 13C, the $Si_3N_4$ insulating layer 27, the $SiO_2$ layer 28, the impurity-doped polysilicon layer 29', the $SiO_2$ spacer layer 45 and the impurity-doped polysilicon layer 46' are formed in this order by the aforementioned process. Then, an $SiO_2$ insulating layer 48 is grown to, for example, 200 angstroms by CVD.

Then, by using the resist process and the RIE process in the photolithography process, the $SiO_2$ layer 48, the polysilicon layer 46', the $SiO_2$ spacer layer 45, the polysilicon layer 29' and the $SiO_2$ spacer layer 28 are selectively removed, so that the surface of the $Si_3N_4$ layer 27 is partially exposed through the opening 28A.

Figure 13D:
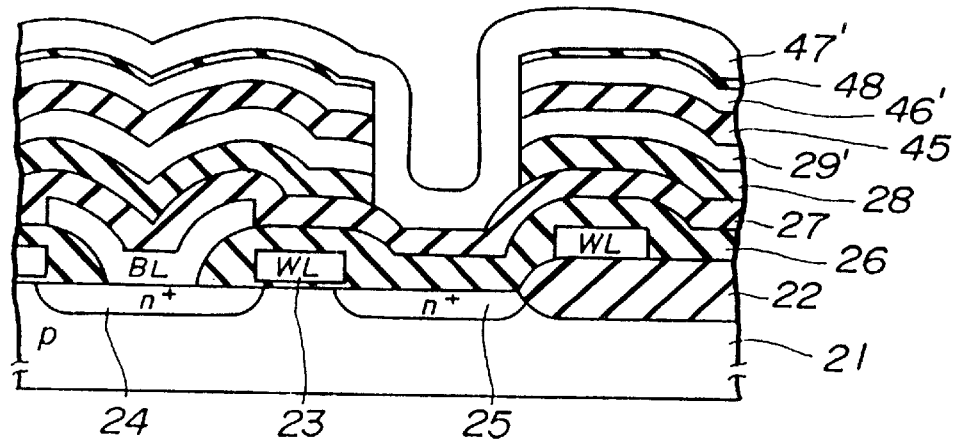
Figure 13E:
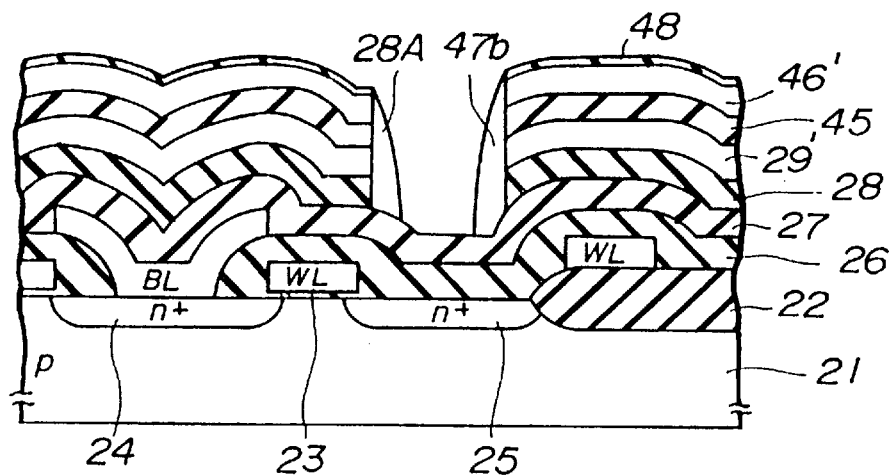

Then, as shown in FIG. 13D, the polysilicon layer 47' is grown to, for example, 2000 angstorms by CVD. After that, as shown in FIG. 13E, the polysilicon layer 47' is selectively etched by RIE, so that a widewall 42b is formed around an inner wall of the opening 28A.

Figure 13F:
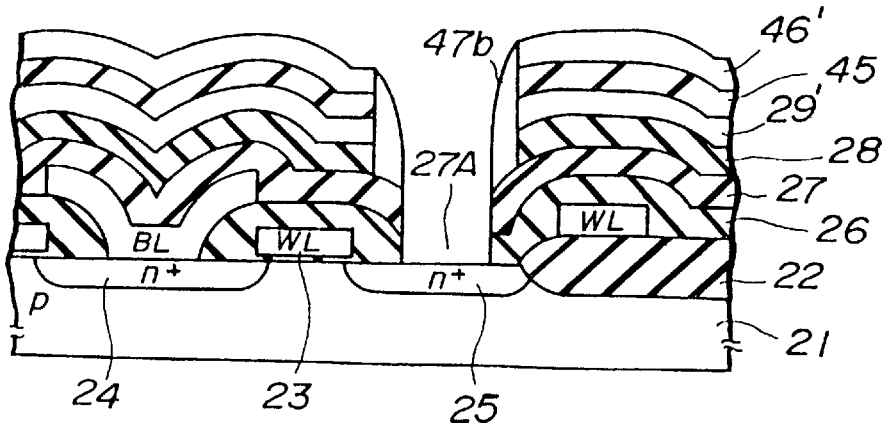

After that, as shown in FIG. 13F, the $Si_3N_4$ layer 27, the $SiO_2$ layer 26 and the $SiO_2$ gate insulating layer 23 are selectively etched via the opening defined by the sidewall 47b. The $SiO_2$ layer 48 is removed at the same time as the $SiO_2$ insulating layer 26 is removed.

It will be noted that the $SiO_2$ layer 48 functions to protect the polysilicon layer 40' against the RIE process of forming the sidewall 47b. Further, the $SiO_2$ layer 48 functions as the mask more stably during the time when the $Si_3N_4$ insulating layer 27 is being etched.

Figure 14A:
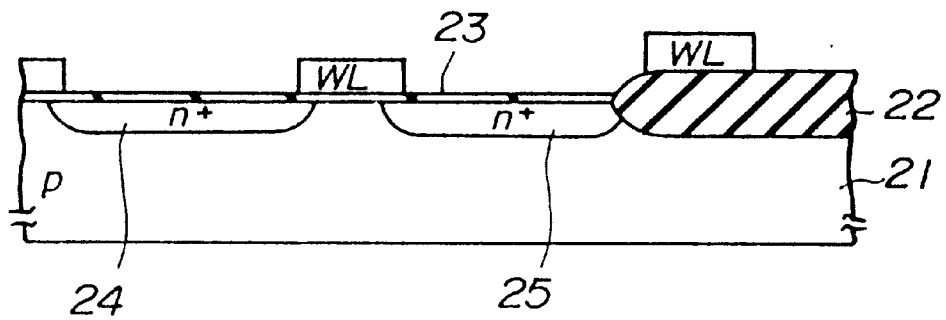
Figure 14B:
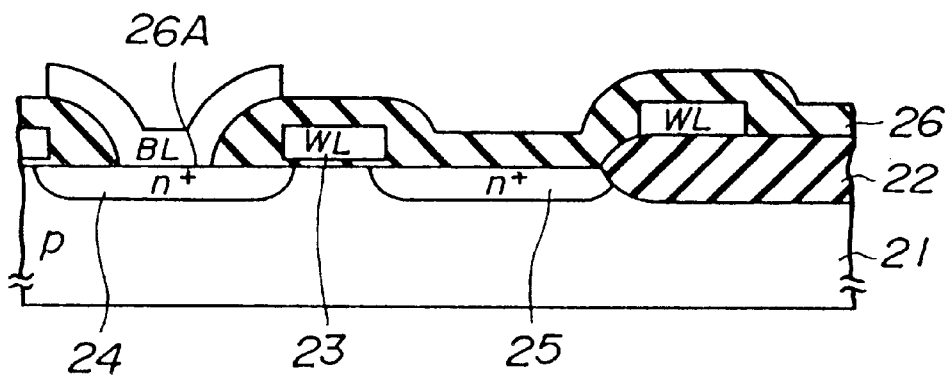

A description will now be given of a modification of the variation shown in FIGS. 13A through 13F, with reference to FIGS. 14A through 14G, in which those parts which are the same as those shown in the previous figures are given the same reference numerals. FIGS. 14A and 14B are the same as FIGS. 11A and 11B, respectively.

Figure 14C:
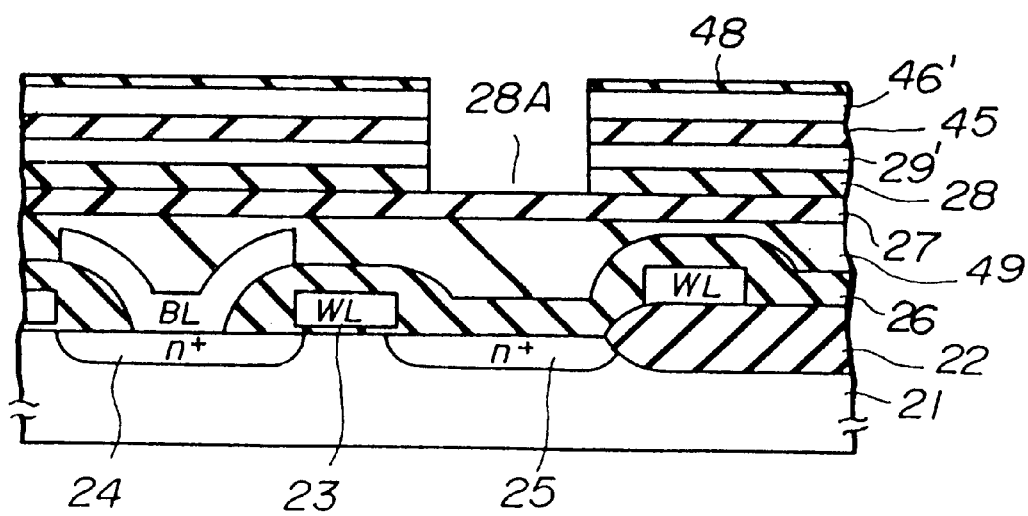

After forming the bit line BL, as shown in FIG. 14C, an SOG (spin on glass) layer 49 is formed on the entire surface so that the surface of the SOG layer 49 is substantially flat enough to prevent the growth of residuum during a subsequent process. There is a possibility that residuum may be formed on a rough surface after the selective etching process. For example, in the variation which has been described with reference to FIGS. 13A through 13F, the $SiO_2$ layer 48 may be partially left on a rough surface portion of the polysilicon layer 46'. For the sake of simplicity, FIG. 14C shows that the SOG layer 49 is completely flat. It can be seen from FIG. 14C, the SOG layer 49 absorbs a roughness of the surface shown in FIG. 14B. It is also possible to form a PSG reflow layer instead of the SOG layer 49. After that, the layers 28, 29' 45, 40' and 48 are formed in the same way as has been described previously. Then, these layers are selectively etched, so that the opening 28A is formed, as shown in FIG. 14C.

Figure 14D:
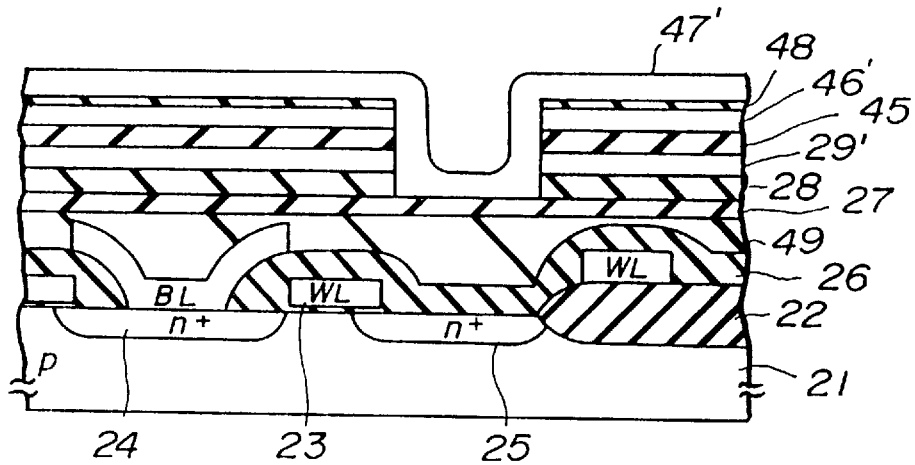
Figure 14E:
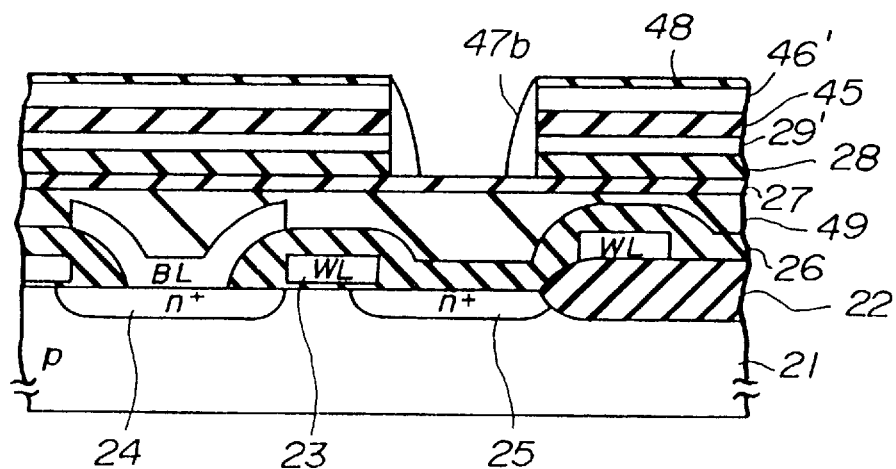
Figure 14F:
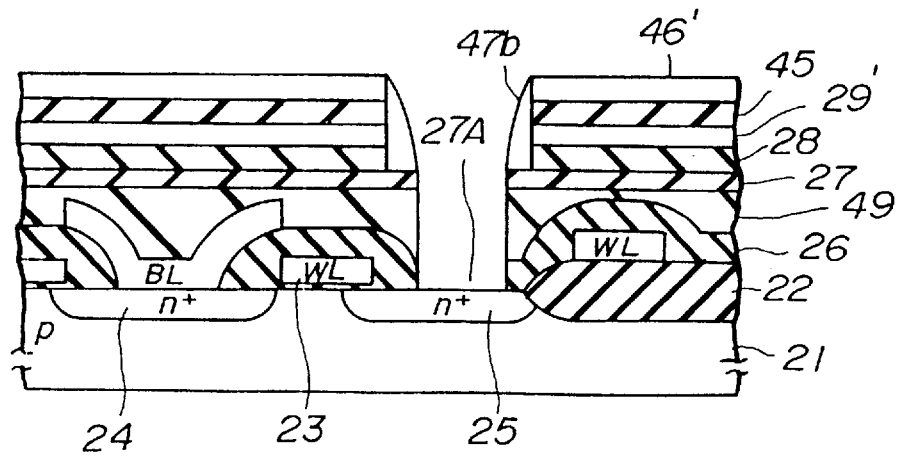

Then, as shown in FIG. 14D, the polysilicon layer 47' is grown to, for example, 2000 angstroms by CVD, and selectively etched by the RIE process, so that a sidewall 47b is formed, as shown in FIG. 14E. Thereafter, as shown in FIG. 14F, the $Si_3N_4$ insulating layer 27, the SOG layer 49, the $SiO_2$ layer 26 and the $SiO_2$ layer 23 are selectively etched, so that the $n^+$-type drain region 25 is partially exposed through the opening 27A. Finally, a DRAM shown in FIG. 14G is fabricated by the aforementioned process which has been described with reference to FIG. 6N.

Figure 15A:
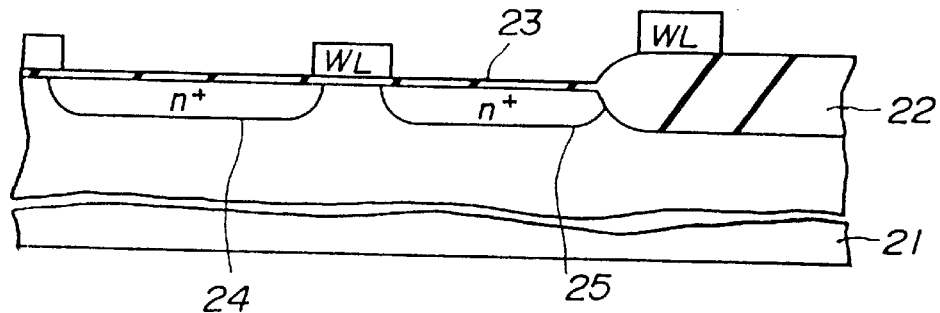
Figure 15B:
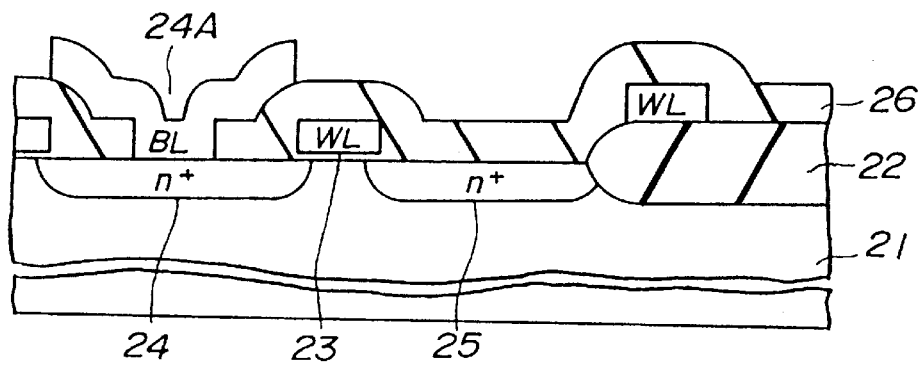
Figure 15C:
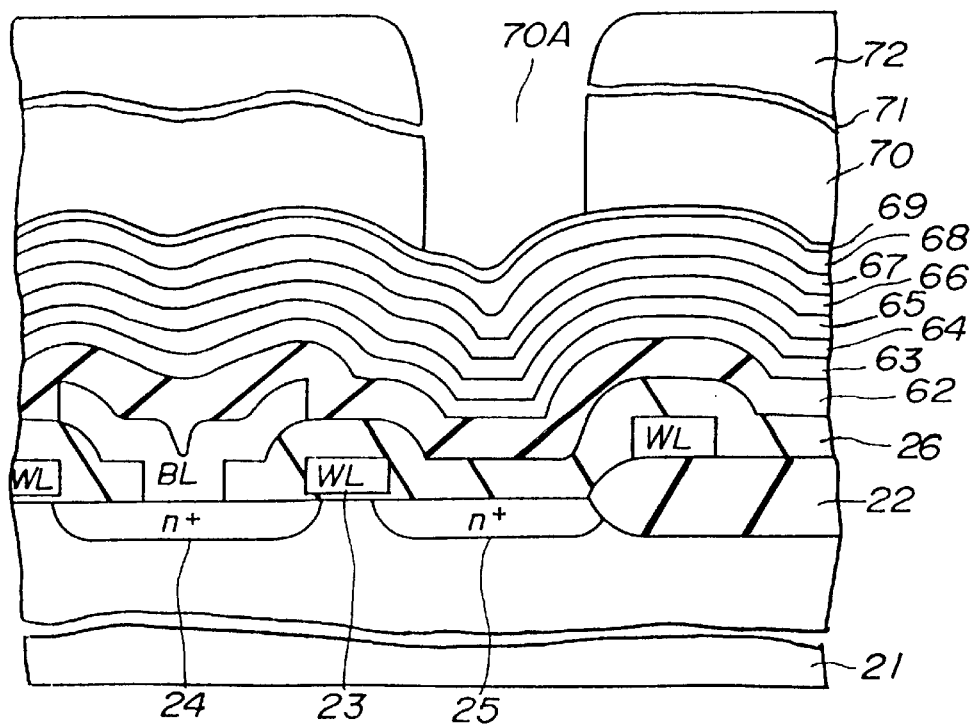

A description will now be given of a tenth preferred embodiment of the present invention with reference to FIGS. 15A through 15J, in which those parts which are the same as those shown in the previous figures are given the same reference numerals. FIGS. 15A and 15B are the same as FIG. 11A and 11B, respectively.

Referring to FIG. 11C, after forming an $Si_3N_4$ layer 62 by CVD, three bilayer structures, each having an $SiO_2$ insulating layer having a thickness of 500 angstroms and a polysilicon layer having a thickness of 500 angstroms, are successively grown by CVD. The first bilayer structure consists of an $SiO_2$ insulating layer 63 and a polysilicon layer 64. The second bilayer structure consists of an $SiO_2$ insulating layer 65 and a polysilicon layer 66. The third bilayer structure consists of an $SiO_2$ insulating layer 67 and a polysilicon layer 68. After that, an $SiO_2$ insulating layer 69 having a thickness of 100 angstroms, a polysilicon layer 70 having a thickness of 2000 angstorms and an $SiO_2$ insulating layer 71 having a thickness of 100 angstroms are successively grown in this order by CVD. Then, a photoresist film 72 having a window pattern is placed on the $SiO_2$ insulating layer 71, and the $SiO_2$ insulating layer 71 and the polysilicon layer 70 are etched, so that an opening 70A is formed. The size of the opening 70A is approximately 0.5 $\mu$m, which is the scale limit in the conventional photolithography technique.

Figure 15D:
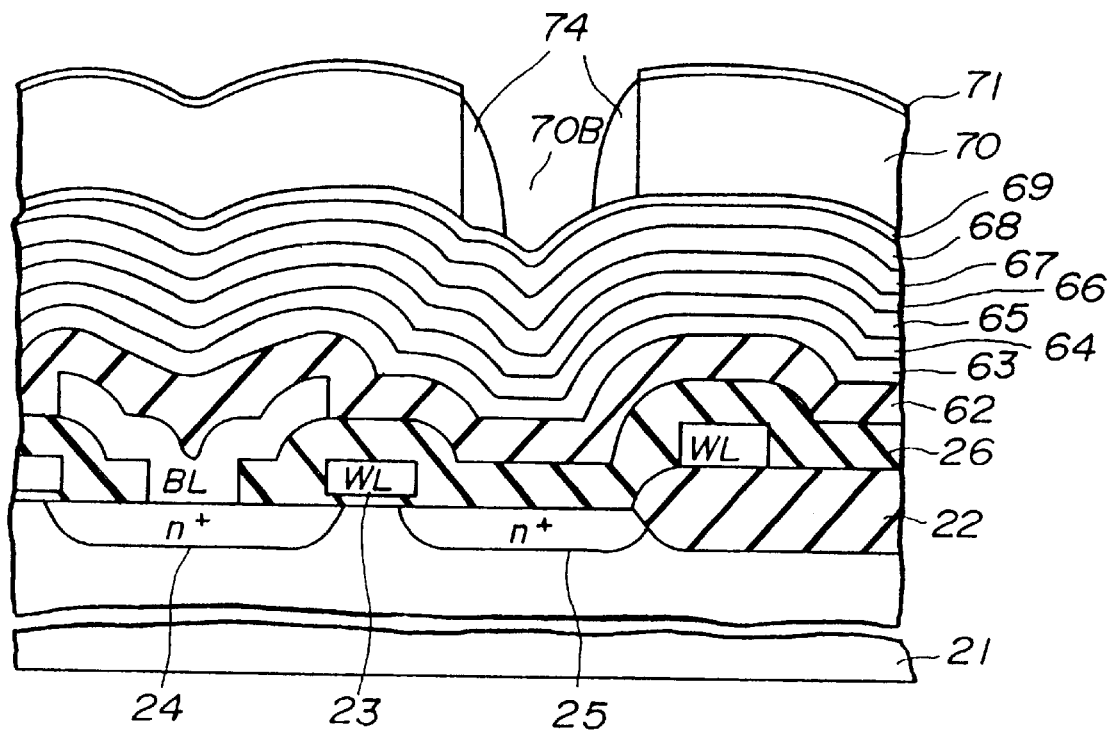

Referring to FIG. 15D, the photoresist film 72 is removed, and a polysilicon layer is grown to, for example, 1500 angstroms on the entire surface. Then, the polysilicon layer is anisotropically etched by an RIE process using an HBr/He gas, so that a polysilicon sidewall 74 is formed around an inner wall of the opening 70A. The polysilicon sidewall 74 defines a new opening 70B having a size approximately equal to 0.2 $\mu$m.

Figure 15E:
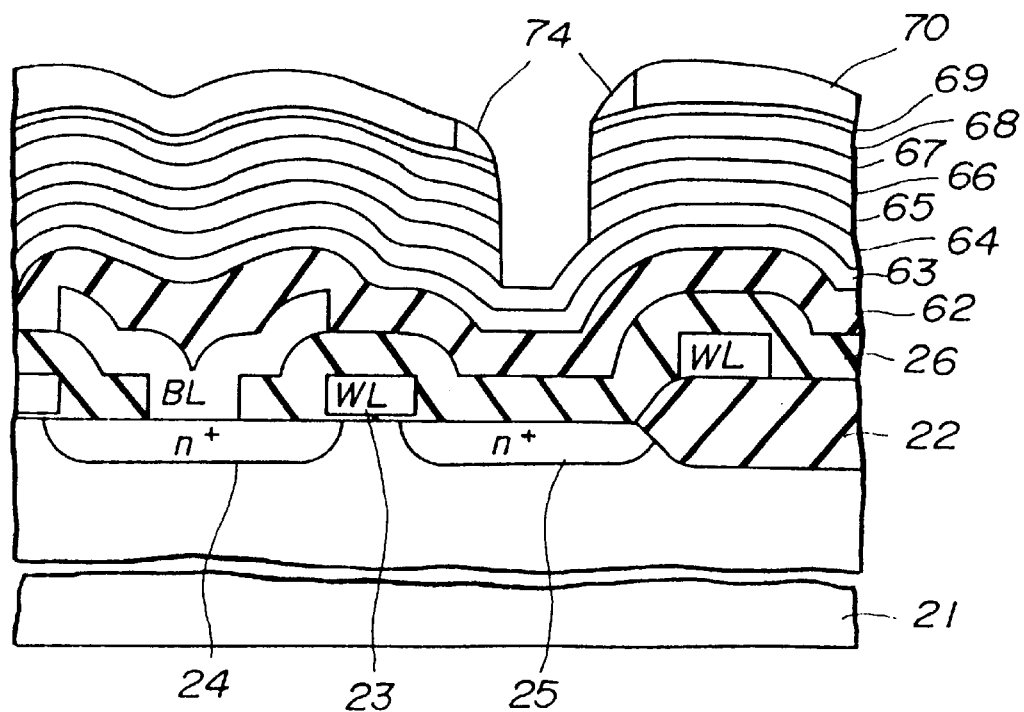

After that, as shown in FIG. 15E, the $SiO_2$ insulating layer 69 and the polysilicon layer 68 are anisotropically etched by an RIE process in which the polysilicon layer 70 and the sidewall 74 function as etching masks. During the time when the $SiO_2$ insulating layer 69 is being etched, the $SiO_2$ insulating layer 71 is removed. Further, during the time when the polysilicon layer 68 is being etched, the polysilicon layer 70 decreases by approximately 700 angstroms, so that a portion thereof having a thickness of about 1300 angstroms is left. After that, the SiO$_2$ insulating layer 67 is removed in an RIE process using a CHF$_3$/H$_2$ gas in which the polysilicon layer 70 and the sidewall 74 function as etching masks. During this etching process, there is little decrease in the thicknesses of the polysilicon layer 70 and the sidewall 74 because the CHF$_3$/H$_2$ gas acts to SiO$_2$ greatly. After that, the polysilicon layer 66 and the SiO$_2$ insulating layer 65 are removed in the same way as has been described above. During this etching process, each of the polysilicon layer 70 and the sidewall 74 decreases by about 700 angstroms, so that they are approximately 600 angstroms thick.

Figure 15F:
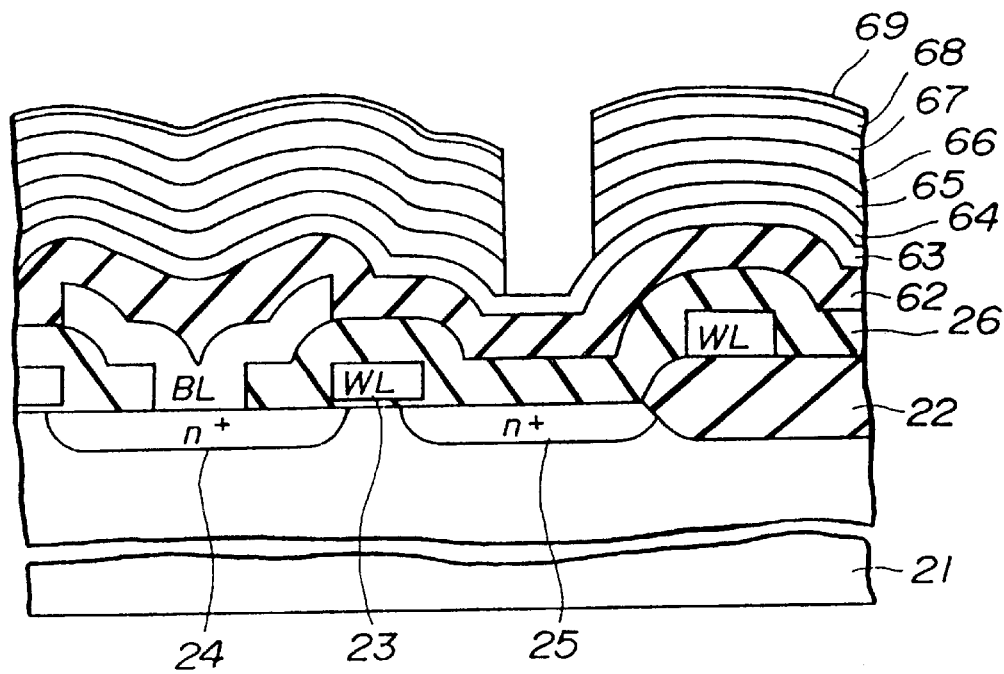

As shown in FIG. 15F, the polysilicon layer 64 is removed by RIE. During this RIE process, the polysilicon layer 70 and the sidewall 74 are also removed. It will be noted that the SiO$_2$ insulating layer 69 prevents the underlying polysilicon layer 68 from being etched even if over-etching is carried out. It is preferable to carry out over-etching so that the polysilicon layer 70 and the sidewall 74 are completely removed.

Figure 15G:
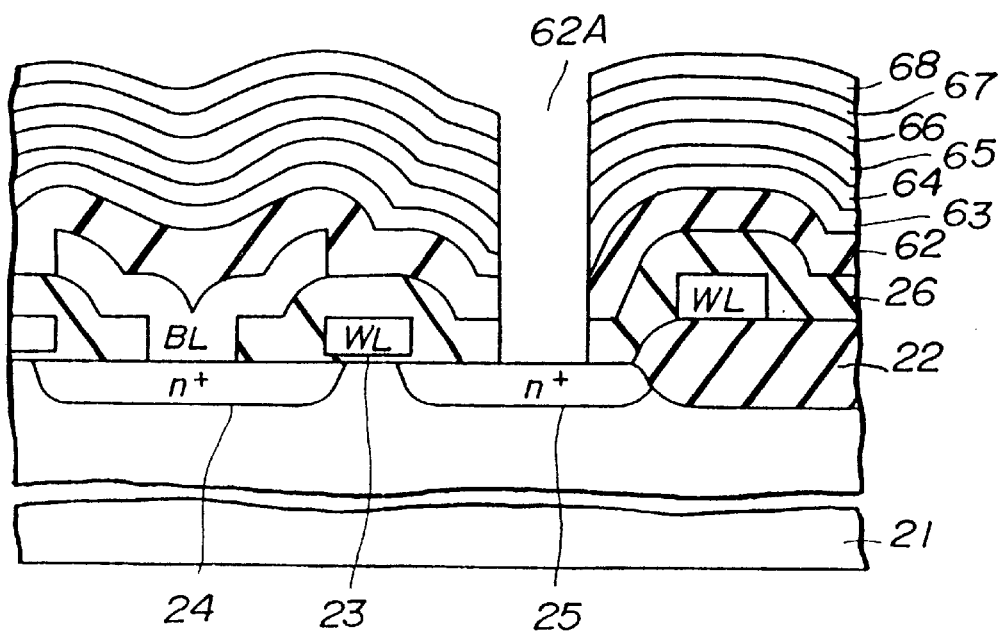

Then, as shown in FIG. 15G, the SiO$_2$ insulating layer 63 is removed in an etching process in which the polysilicon layer 68 functions as a mask. During this etching, the SiO$_2$ insulating layer 69 is also removed. Subsequently, the Si$_3$N$_4$ insulating layer 62 is etched, and the SiO$_2$ insulating layer 26 and SiO$_2$ gate insulating layer 23 are etched. Thereby, a window formed in the layers 68 through 23 is formed, as shown in FIG. 15G.

Figure 15H:
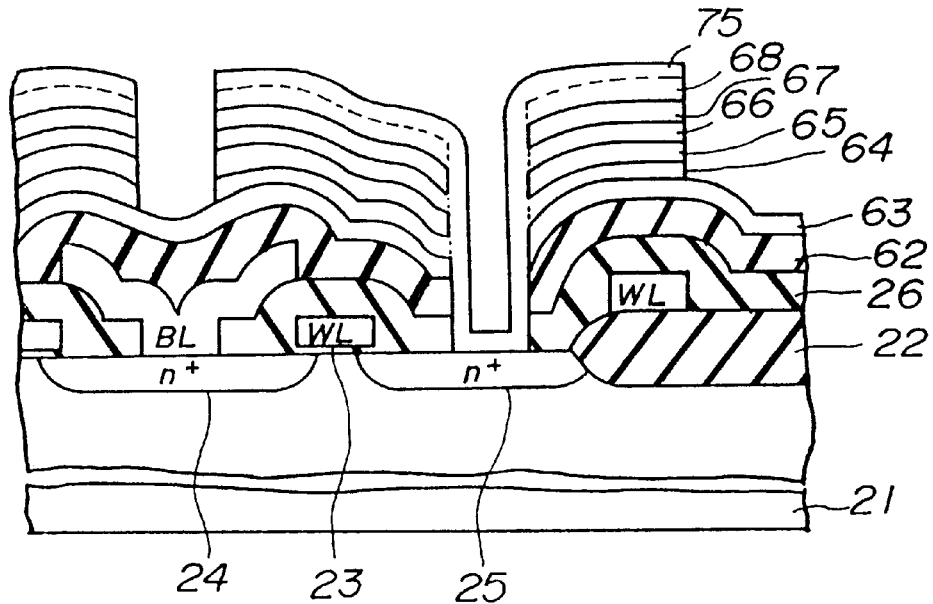

Then, referring to FIG. 15H, a polysilicon layer 75 is grown to, for example, 500 angstroms on the entire surface including the window shown in FIG. 15G. After that, the polysilicon layers 75 and 68, the SiO$_2$ insulating layer 67, the polysilicon layer 66, the SiO$_2$ insulating layer 65, and the polysilicon layer 64 are patterned into the shape of the storage electrode. Thereby, a device shown in FIG. 15H is formed.

Figure 15I:
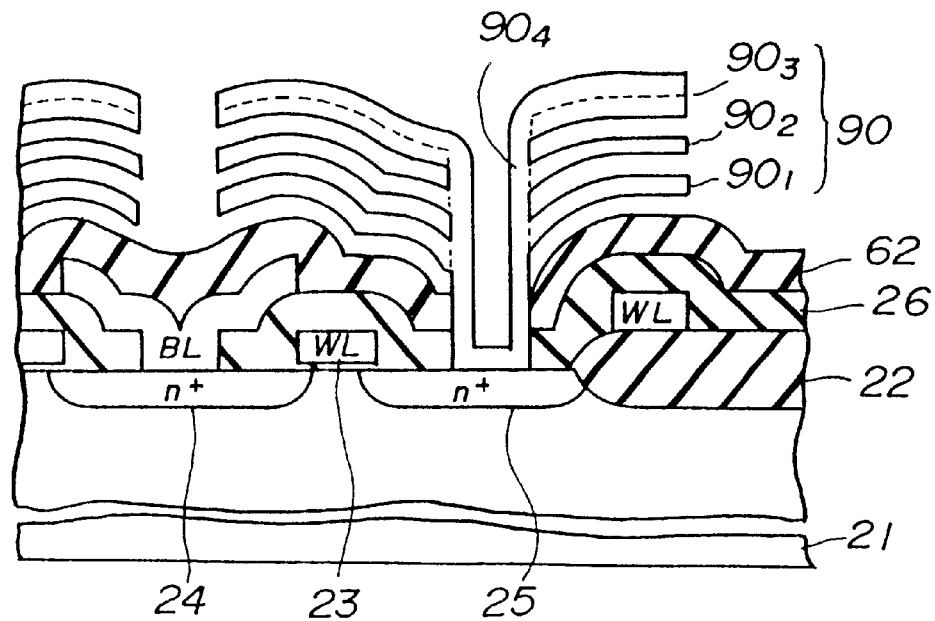

After that, as shown in FIG. 15I, the device shown in FIG. 15H is placed in an HF etchant, so that the SiO$_2$ insulating layers 67, 65 and 63 are isotropically etched and completely removed. By this step, a storage electrode 90 can be obtained. The storage electrode 90 has a first polysilicon fin 90$_1$ formed of the patterned polysilicon layer 64, a second polysilicon fin 90$_2$ formed of the patterned polysilicon layer 66, and a third polysilicon fin 90$_3$ having the patterned polysilicon layers 68 and 75, and a vertical connecting portion formed of the polysilicon layer 75. The third polysilicon fin 90$_3$ is thicker than the first and second polysilicon fins 90$_1$ and 90$_2$.

After that, the aforementioned processes are carried out for the device shown in FIG. 15I, so that a DRAM shown in FIG. 15J can be formed. It is possible to apply the teachings shown in FIGS. 13A through 13F to the tenth embodiment of the present invention. It is also possible to form the lowermost fin9-$_1$ directly on the insulating layer 62. In this case, the insulating layer 62 can be formed of SiO$_2$.

The present invention is not limited to the specifically disclosed embodiments, and variations and modifications may be made without departing from the scope of the present invention.

What is claimed is:

1. A dynamic random access memory comprising:
   a semiconductor substrate having a first diffusion region and a second diffusion region of a transfer transistor;
   a first insulating layer having a first contact hole exposing said first diffusion region, and a second contact hole exposing said second diffusion region;
   a word line covered by said first insulating layer;
   a stacked capacitor which is in contact with said first diffusion region through said first contact hole;
   a bit line which is in contact with said second diffusion region through said second contact hole; and
   a second insulating layer covering said stacked capacitor,
   said stacked capacitor including a storage electrode, a dielectric film and a cell plate,
   said storage electrode which is in contact with said first diffusion region through said first contact hole having a first fin having a first film, a second film and a third film,
   said first film having a first opening having a width greater than that of said first contact hole,
   said second film serving as a sidewall being formed around an inner wall of said first film defining said first opening, so that a second opening defined by the second film has a width substantially identical to that of said first contact hole, and
   said third film extending on said second film and over said first film, substantially vertically extending in said first contact hole, and being in contact with said first diffusion region.

2. A dynamic random access memory as claimed in claim 1, wherein:
   said storage electrode includes a second fin having a contact area in which said second fin is in contact with said first fin;
   said contact area is wider than said first contact hole; and
   said first and second fins are spaced apart from each other.

3. A dynamic random access memory as claimed in claim 1, wherein said first fin is spaced apart from said first insulating layer.

4. A dynamic random access memory as claimed in claim 1, wherein said first fin of said storage electrode is formed on said first insulating layer.

5. A dynamic random access memory as claimed in claim 2, wherein said first fin of said storage electrode is thicker than said third film thereof.

6. A dynamic random access memory as claimed in claim 1, wherein said first, second and third films include polysilicon.

7. A dynamic random access memory comprising:
   a semiconductor substrate having a first diffusion region and a second diffusion region of a transfer transistor;
   a first insulating layer having a first contact hole exposing said first diffusion region, and a second contact hole exposing said second diffusion region;
   a word line covered by said first insulating layer;
   a stacked capacitor which is in contact with said first diffusion region through said first contact hole;
   a bit line which is in contact with said second diffusion region through said second contact hole; and
   a second insulating layer covering said stacked capacitor,
   said stacked capacitor including a storage electrode, a dielectric film and a cell plate, and
   said storage electrode which is in contact with said first diffusion region through said first contact hole having a plurality of first fin-shaped films located outside of said first contact hole, a second film connecting said first fin-shaped films to each other, and a third film extending on an uppermost one of said first fin-shaped films and said second film, substantially vertically extending in said first contact hole, and being in contact with said first diffusion region.

8. A dynamic random access memory as claimed in claim 7, wherein:
said second film of said storage electrode is spaced apart from said first insulating layer; and
a lowermost one of said first fin-shaped films of said storage electrode is spaced apart from said first insulating layer.

9. A dynamic random access memory as claimed in claim 7, wherein:
said second film of said storage electrode is in contact with said first insulating layer; and
a lowermost one of said first fin-shaped films of said storage electrode is spaced apart from said first insulating layer.

10. A dynamic random access memory as claimed in claim 9, wherein said storage electrode has a substantially flat surface which extends above said word line.

11. A dynamic random access memory as claimed in claim 7, wherein said storage electrode includes polysilicon.

12. A dynamic random access memory comprising:
a semiconductor substrate having a first diffusion region and a second diffusion region of a transfer transistor;
a first insulating layer having a first contact hole exposing said first diffusion region, and a second contact hole exposing said second diffusion region;
a word line covered by said first insulating layer;
a stacked capacitor which is in contact with said first diffusion region through said first contact hole;
a bit line which is in contact with said second diffusion region through said second contact hole; and
a second insulating layer covering said stacked capacitor,
said stacked capacitor including a storage electrode, a dielectric film and a cell plate, and
said storage electrode which is in contact with said first diffusion region through said first contact hole having a plurality of first fin-shaped films located outside of said first contact hole, and a second film connecting said first fin-shaped films to each other, and extending on an uppermost one of said first fin-shaped films, said second film substantially vertically extending in said first contact hole, and being in contact with said first diffusion region.

13. A dynamic random access memory as claimed in claim 12, wherein a lowermost one of said first fin-shaped films is spaced apart from said first insulating layer.

14. A dynamic random access memory device as claimed in claim 12, wherein a lowermost one of said first fin-shaped films is in contact with said first insulating layer.

15. A dynamic random access memory as claimed in claim 12, wherein said storage electrode includes polysilicon.

16. A fin-shaped capacitor comprising:
a storage electrode having an exposed surface;
a dielectric film formed around said exposed surface of said storage electrode; and
a cell plate covering said storage electrode surrounded by said dielectric film,
said storage electrode being in contact with a diffusion region of a semiconductor substrate through a contact hole formed in an insulating layer formed on said semiconductor substrate,
said storage electrode having a first fin having a first film, a second film and a third film,
said first film having a first opening having a width greater than that of said contact hole,
said second film being formed around an inner wall of said first film defining said first opening, so that a second opening defined by the second film, has a width substantially identical to that of said contact hole, and
said third film extending on said second film and over said first film, substantially vertically extending in said first contact hole, and being in contact with said first diffusion region in said semiconductor substrate.

17. A fin-shaped capacitor as claimed in claim 16, wherein:
said storage electrode includes a second fin having a contact area in which said second fin is in contact with said first fin;
said contact area is wider than said contact hole; and
said first and second fins are spaced apart from each other.

18. A fin-shaped capacitor as claimed in claim 16, wherein said first fin is spaced apart from said insulating layer.

19. A fin-shaped capacitor as claimed in claim 16, wherein said first fin of said storage electrode is formed on said insulating layer.

20. A fin-shaped capacitor as claimed in claim 17, wherein said first fin of said storage electrode is thicker than said third film thereof.

21. A fin-shaped capacitor as claimed in claim 16, wherein said first, second and third films include polysilicon.

22. A fin-shaped capacitor comprising:
a storage electrode having an exposed surface;
a dielectric film formed around said exposed surface of said storage electrode; and
a cell plate covering said storage electrode surrounded by said dielectric film,
said storage electrode being in contact with a diffusion region of a semiconductor substrate through a contact hole formed in an insulating layer formed on said semiconductor substrate, and
said storage electrode having a plurality of first fin-shaped films located outside of said contact hole, a second film connecting said first fin-shaped films to each other, and a third film extending on an uppermost one of said first fin-shaped films and said second film, substantially vertically extending in said contact hole, and being in contact with said diffusion region of said semiconductor substrate.

23. A fin-shaped capacitor as claimed in claim 22, wherein:
said second film of said storage electrode is spaced apart from said insulating layer; and
a lowermost one of said first fin-shaped films of said storage electrode is spaced apart from said insulating layer.

24. A fin-shaped capacitor as claimed in claim 22, wherein:
said second film of said storage electrode is in contact with said insulating layer; and
a lowermost one of said first fin-shaped films of said storage electrode is spaced apart from said insulating layer.

25. A fin-shaped capacitor as claimed in claim 24, wherein said insulating layer has a substantially flat surface of which said second film of said storage electrode is formed.

26. A fin-shaped capacitor as claimed in claim 22, wherein said storage electrode includes polysilicon.

27. A fin-shaped capacitor comprising:
a storage electrode having an exposed surface;
a dielectric film formed around said exposed surface of said storage electrode; and a cell plate covering said storage electrode surrounded by said dielectric film, said storage electrode being in contact with a diffusion region of a semiconductor substrate through a contact hole formed in an insulating layer formed on said semiconductor substrate, said storage electrode having a plurality of first fin-shaped films located outside of said contact hole, and a second film connecting said first fin-shaped films to each other, and extending on an uppermost one of said first fin-shaped films, said second film substantially vertically extending in said contact hole, and being in contact with said diffusion region in said semiconductor substrate.

28. A fin-shaped capacitor as claimed in claim 27, wherein a lowermost one of said first fin-shaped films is spaced apart from said insulating layer.

29. A fin-shaped capacitor device as claimed in claim 27, wherein a lowermost one of said first fin-shaped films is in contact with said insulating layer.

30. A fin-shaped capacitor as claimed in claim 27, wherein said storage electrode includes polysilicon.

31. A dynamic random access memory comprising:

a semiconductor substrate having a first diffusion region and a second diffusion region of a transfer transistor;

a first insulating layer having a first contact hole exposing said first diffusion region, and a second contact hole exposing said second diffusion region;

a word line covered by said first insulating layer;

a stacked capacitor which is in contact with said first diffusion region through said first contact hole;

a bit line which is in contact with said second diffusion region through said second contact hole; and a second insulating layer covering said stacked capacitor;

said stacked capacitor including a storage electrode, a dielectric film and a cell plate, said storage electrode which is in contact with said first diffusion region through said first contact hole having a first film, a second film and a third film, said first film having a first opening having a width greater than that of said first contact hole, said second film serving as a sidewall being formed around an inner wall of said first film defining said first opening, so that a second opening defined by the second film has a width substantially identical to that of said first contact hole, and said third film extending on said second film and over said first film, substantially vertically extending in said first contact hole, and being in contact with said first diffusion region.

32. A storage electrode for an integrated circuit formed in a substrate, the storage electrode comprising:

a first conductive film overlying the substrate and having a first opening formed by an inner surface of said first conductive film;

a second conductive film having an outer surface contacting the inner surface of said first conductive film in the first opening and having an inner surface forming a second opening with a width less than the first opening; and a third conductive film extending over said first conductive film, contacting the inner surface of said second conductive film, and extending through the second opening to contact the substrate.

33. A storage electrode as claimed in claim 32, wherein the first, second and third conductive films are formed primarily of polysilicon.

34. A storage electrode as claimed in claim 32, wherein said second conductive film has a first end closer to the substrate than a second end and the inner surface of said second conductive film curves toward the outer surface at the second end.

\* \* \* \* \*